US012166047B2

(12) United States Patent
Cai et al.

(10) Patent No.: US 12,166,047 B2
(45) Date of Patent: Dec. 10, 2024

(54) DISPLAY PANEL AND DISPLAY DEVICE

(71) Applicant: Hubei Yangtze Industrial Innovation Center Of Advanced Display Co., Ltd., Wuhan (CN)

(72) Inventors: Yu Cai, Wuhan (CN); Shanshan Zheng, Shanghai (CN); Ping An, Shanghai (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 18/201,695

(22) Filed: May 24, 2023

(65) Prior Publication Data

US 2023/0299094 A1 Sep. 21, 2023

Related U.S. Application Data

(63) Continuation of application No. 17/243,425, filed on Apr. 28, 2021, now Pat. No. 11,699,710.

(30) Foreign Application Priority Data

Nov. 25, 2020 (CN) .......................... 202011339983.3

(51) Int. Cl.
*H01L 27/12* (2006.01)
(52) U.S. Cl.
CPC ...... *H01L 27/1248* (2013.01); *H01L 27/1225* (2013.01); *H01L 27/124* (2013.01)

(58) Field of Classification Search
CPC . H01L 27/1248; H01L 27/12; H01L 27/1225; H01L 27/124; G09F 9/301; G09F 9/30; G09F 9/35; G09F 9/303; G09F 9/00; H10K 59/12; H10K 59/00; H10K 59/10; H10K 59/17; H10K 59/131; H10K 59/38
See application file for complete search history.

(56) References Cited

U.S. PATENT DOCUMENTS 10,249,652 B2 * 4/2019 Li ................... H01L 21/76802
2018/0366496 A1 * 12/2018 Li ......................... H10K 59/122

FOREIGN PATENT DOCUMENTS

| CN | 109671740 A | 4/2019 |
|----|-------------|--------|
| CN | 110112142 A | 8/2019 |
| CN | 107424957 B | 1/2020 |

* cited by examiner

*Primary Examiner* — Nikolay K Yushin
(74) *Attorney, Agent, or Firm* — KDW Firm PLLC

(57) ABSTRACT

Provided are a display panel and a display device. The display panel includes a base substrate, a first transistor, and a planarization layer. The first transistor includes a first active layer, a first gate, a first source, and a first drain. The planarization layer is located above the first source. In the direction perpendicular to the base substrate, at least one insulating layer and a first organic area are provided between the film layer where the first active layer is located and the planarization layer. An insulating layer in the first organic area is made of organic material and the first organic area is located in a display area.

19 Claims, 17 Drawing Sheets

DISPLAY PANEL AND DISPLAY DEVICE

CROSS-REFERENCE TO RELATED APPLICATIONS

This is a Continuation Application of U.S. patent application Ser. No. 17/243,425, which claims priority to Chinese Patent Application No. 202011339983.3 filed Nov. 25, 2020, disclosures of which are incorporated herein by reference in their entireties.

TECHNICAL FIELD

Embodiments of the present disclosure relate to the technical field of display, and in particular, to a display panel and a display device.

BACKGROUND

The development of the traditional flat-panel display device technology has become increasingly mature, and the flexible display panel is about to become the mainstream display field due to the characteristics of the flexible display panel such as lightweight, thinness, bendability, and impact resistance. The organic light-emitting display (OLED) has become one of the research hotspots in the flexible display field in recent years due to the excellent performances of the OLED such as fast response speed, wide viewing angle, high brightness, low power consumption, self-luminous devices, and bending resistance.

In the existing flexible display panel, due to a large number of electronic elements and the limited bendability of the display panel, how to further improve the bendability of the flexible display panel has become a research of significant interest.

SUMMARY

The present disclosure provides a display panel and a display device. A first organic area is added between the film layer where a first active layer is located and the film layer where a planarization layer is located, the first organic area is located in a display area, and an insulating layer in the first organic area is made of organic material. In this manner, the bendability of the display panel can be improved.

In a first aspect, an embodiment of the present disclosure provides a display panel. The display panel includes a base substrate, a first transistor, and a planarization layer.

The first transistor includes a first active layer, a first gate, a first source, and a first drain. The first source and the first drain are located on one side of the first active layer facing away from the base substrate. The first gate is located between the first active layer, and both the first source and the first drain.

The planarization layer is located on a same side of the first source and the first drain facing away from the base substrate.

In the direction perpendicular to the base substrate, at least one insulating layer and a first organic area are provided between the film layer where the first active layer is located and the planarization layer. An insulating layer in the first organic area is made of organic material.

The display panel includes a display area and a non-display area. The first organic area is located in the display area.

In a second aspect, an embodiment of the present disclosure further provides a display device. This display device includes the display panel provided in the first aspect.

The display panel provided in an embodiment of the present disclosure includes a first transistor. The first transistor includes a first active layer, a first source, and a first drain. Meanwhile, the display panel further includes a planarization layer located on one side of the first source facing away from the first active layer. A first organic area is added to the display area between the film layer where the first planarization layer is located and the film layer where the first active layer is located. An insulating layer in the first organic area is made of organic material. Since the Young's modulus of the organic material is relatively small and the bendability of the organic material is good, compared with the related art, in the solution provided in embodiments of the present disclosure, on the one hand, the bendability of the display panel can be improved, and thus the bending stress can be avoided or reduced; on the other hand, if a crack occurs in the inorganic material, the organic material in the first organic area can block the crack in the inorganic material, and thus prevent or slow the spread of the crack. In this manner, the good bendable display effect of the display panel can be achieved.

DETAILED DESCRIPTION

Figure 1:
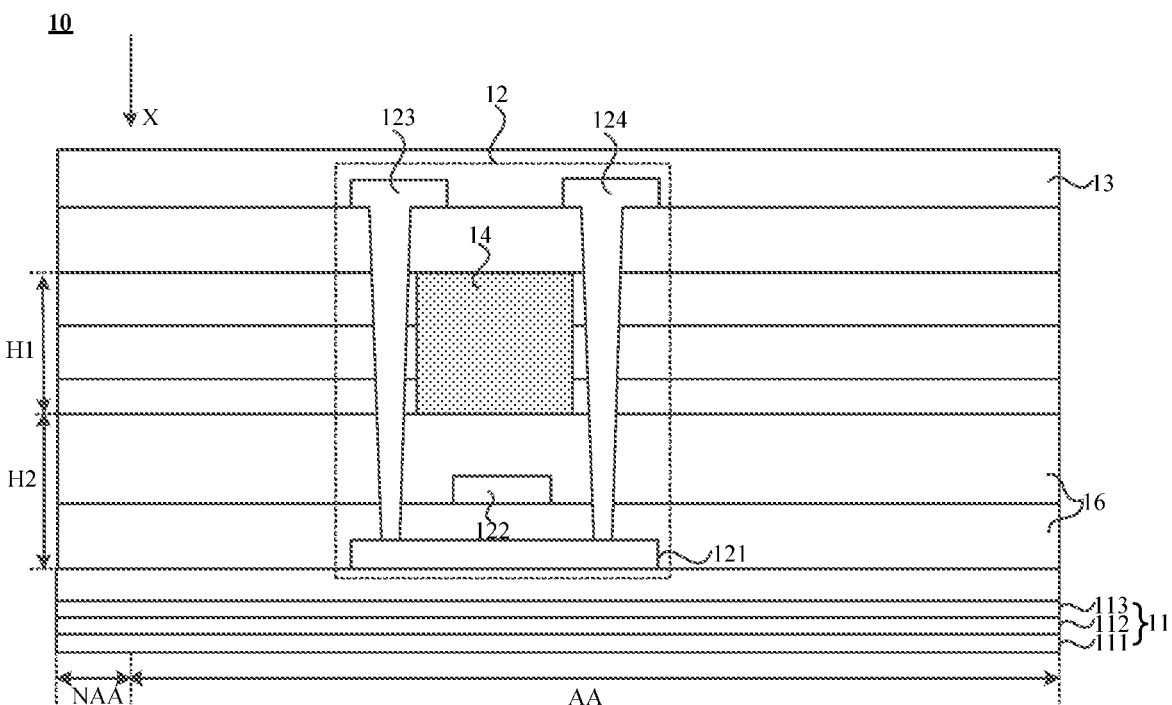
FIG. 1 is a structure view of a display panel according to an embodiment of the present disclosure.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

FIG. 1 is a structure view of a display panel 10 according to an embodiment of the present disclosure. As shown in FIG. 1, the display panel 10 includes, in part, a base substrate 11, a first transistor 12, and a planarization layer 13. The first transistor 12 includes a first active layer 121, a first gate 122, a first source 123, and a first drain 124. The first source 123 and the first drain 124 are located on one side of the first active layer 121 facing away from the base substrate 11. The first gate 122 is located between the first active layer 121, and both the first source 123 and the first drain 124. The planarization layer 13 is located on a same side of the first source 123 and the first drain 124 facing away from the base substrate 11. In the direction perpendicular to the base substrate 11 (the X direction as shown in FIG. 1), at least one insulating layer and a first organic area 14 are provided between the film layer where the first active layer 121 is located and the planarization layer 13. An insulating layer in the first organic area 14 is made of organic material. The display panel 10 includes a display area AA and a non-display area NAA. The first organic area 14 is located in the display area AA.

As shown in FIG. 1, the first transistor 12 may include a first active layer 121, a first gate 122, a first source 123, and a first drain 124. The first gate 122 is located between the first active layer 121, the first source 123 and the first drain 124, that is, the first transistor 12 may include a top-gate structure. In another embodiment, the display panel 10 may further include a planarization layer 13. An insulating layer and a first organic area 14 are disposed between the film layer where the first active layer 121 is located and the film layer where the planarization layer 13 is located. The insulating layer in the first organic area 14 is made of organic material. Since the Young's modulus of the organic material is less than the Young's modulus of the inorganic material and the organic material has a good bendability, compared with the related art, the beneficial effects of the display panel provided in an embodiment of the present disclosure are described as follows: on the one hand, the bendability of the display panel can be improved, and thus the bending stress can be avoided or reduced; on the other hand, if a crack occurs in the inorganic material, due to the existence of an interface between the organic material and the inorganic material, the crack may end at the interface; or even if the crack further extends into the organic material, since the Young's modulus of the organic material is less than the Young's modulus of the inorganic material, and the organic material is soft and has a good toughness, it is not easy for the crack to continue to propagate in the organic material. Therefore, the organic material in the first organic area can block the crack in the inorganic material, and thus prevent or slow the spread of the crack. In this manner, a highly bendable display panel can be formed. It is understood that the organic material in the first organic area can block the crack in the inorganic material in the direction perpendicular to the base substrate 11 (the X direction as shown in FIG. 1), and thus prevent or slow the spread of the crack; the organic material in the first organic area can also block the crack in the inorganic material in other directions that intersect with the X direction, and thus prevent or slow the spread of the crack. For example, in the direction parallel to the base substrate, as long as the first organic area is located on the extension path of the crack, the first organic area can prevent or slow the spread of the crack.

It is noted that the first organic area 14 is disposed between the film layer where the first active layer 121 is located and the film layer where the planarization layer 13 is located. In the direction perpendicular to the base substrate 11 (the X direction as shown in FIG. 1), the first organic area 14 may be partially overlapped, completely overlapped, or not overlapped with the first active layer 121, that is, the vertical projection of the first organic area 14 on the plane where the base substrate 11 is located is partially overlapped, or completely overlapped, or not overlapped with the vertical projection of the first active layer 121 on the plane where the base substrate 11 is located. In FIG. 1, only the case where the vertical projection of the first organic area 14 on the plane where the base substrate 11 is located is completely overlapped with the vertical projection of the first active layer 121 on the plane where the base substrate 11 is located is used as an example, which is not limited in an embodiment of the present disclosure as long as the first organic area 14 is disposed so that the bendability of the display panel can be improved and the crack in the inorganic material can be blocked.

The display panel 10 may further include, in part, a display area AA and a non-display area NAA. The non-display area NAA is located on at least one side of the display area AA. In FIG. 1, the case where the non-display area NAA is located on one side of the display area AA is used as an example. The first organic area 14 is located in the display area AA so that it can be ensured that the first organic area 14 improves the bendability in the display area AA while the crack in the inorganic material can be blocked from further spreading in the display area AA. In an embodiment, the display area AA may include multiple sub-pixels (not shown in the figure), each sub-pixel may include a light-emitting unit and a pixel circuit (not shown in the figure) that drives the light-emitting unit to emit light, and the pixel circuit may include multiple transistors (not shown in the figure). The first transistor 12 may be one of the transistors in the pixel circuit. Alternatively, the first transistor 12 may also be an element in other structures. For example, the first transistor 12 may be one of the transistors in a gate drive circuit (not shown in the figure), or the first transistor 12 may be one of the transistors in a shorting bar (not shown in the figure), or the first transistor 12 may be one of the transistors in the multiplex output selection circuit. An embodiment of the present disclosure does not limit the specific existence form of the first transistor 12.

In an embodiment, the base substrate 11 may be a flexible base substrate or a rigid base substrate, which is not limited in an embodiment of the present disclosure. In the case where the base substrate 11 is a flexible substrate, the base substrate 11 may include a polyimide substrate so that it can be ensured that the flexible substrate has good high-temperature resistance and a good insulation performance; and the base substrate 11 may include one layer of polyimide substrate or two layers of polyimide substrates, which is also not limited in an embodiment of the present disclosure. In the case where the base substrate 11 includes one layer of polyimide substrate, the base substrate 11 is simple in structure and preparation process, which is beneficial to achieve the design requirements of the base substrate 11 and the entire display panel for lightweight and thinness. In another embodiment, since the polyimide substrate is generally prepared on a rigid substrate, after the pixel circuit and the light-emitting element are prepared on the base substrate 11, the rigid substrate is generally stripped and removed through the laser lift-off technique. The polyimide substrate may be damaged when the rigid substrate is removed through the laser lift-off technique. Therefore, in the case where the base substrate 11 includes two layers of polyimide substrates, for example, the base substrate 11 includes a first polyimide substrate and a second polyimide substrate, a buffer layer is disposed between the first polyimide substrate and the second polyimide substrate, the first polyimide substrate is prepared on the rigid substrate, and the pixel circuit and the light-emitting element are prepared on the second polyimide substrate. Even if the first polyimide substrate may be damaged when the rigid substrate is removed through the laser lift-off technique, the integrity of the second polyimide substrate can still be guaranteed, and thus the integrity of the entire display panel can be guaranteed. In FIG. 1, only the case where the base substrate 11 is a flexible substrate and includes a first flexible substrate 111 and a second flexible substrate 113, and an insulating layer 112 that is located between the first flexible substrate 111 and the second flexible substrate 113 is used as an example, where the first flexible substrate 111 and the second flexible substrate 113 are polyimide substrates.

As described above, a display panel provided in an embodiment of the present disclosure includes a first transistor that includes a first active layer, a first source, and a first drain. The display panel further includes, in part, a planarization layer located on one side of the first source facing away from the first active layer. A first organic area is added to the display area between the film layer where the first planarization layer is located and the film layer where the first active layer is located. An insulating layer in the first organic area is made of organic material. Since the Young's modulus of the organic material is relatively small and the organic material has a good bendability, compared with the related art, in the solution provided in embodiments of the present disclosure, on the one hand, the bendability of the display panel can be improved, and thus the bending stress can be avoided or reduced; on the other hand, if a crack occurs in the inorganic material, the crack can end at the interface between the inorganic material and the organic material, or even if the crack extends into the organic material, as long as the first organic area is located on the extension path of the crack, the organic material in the first organic area can block the crack in the inorganic material, and thus prevent or slow the spread of the crack. In this manner, the good bendable display effect of the display panel can be achieved.

Figure 2:
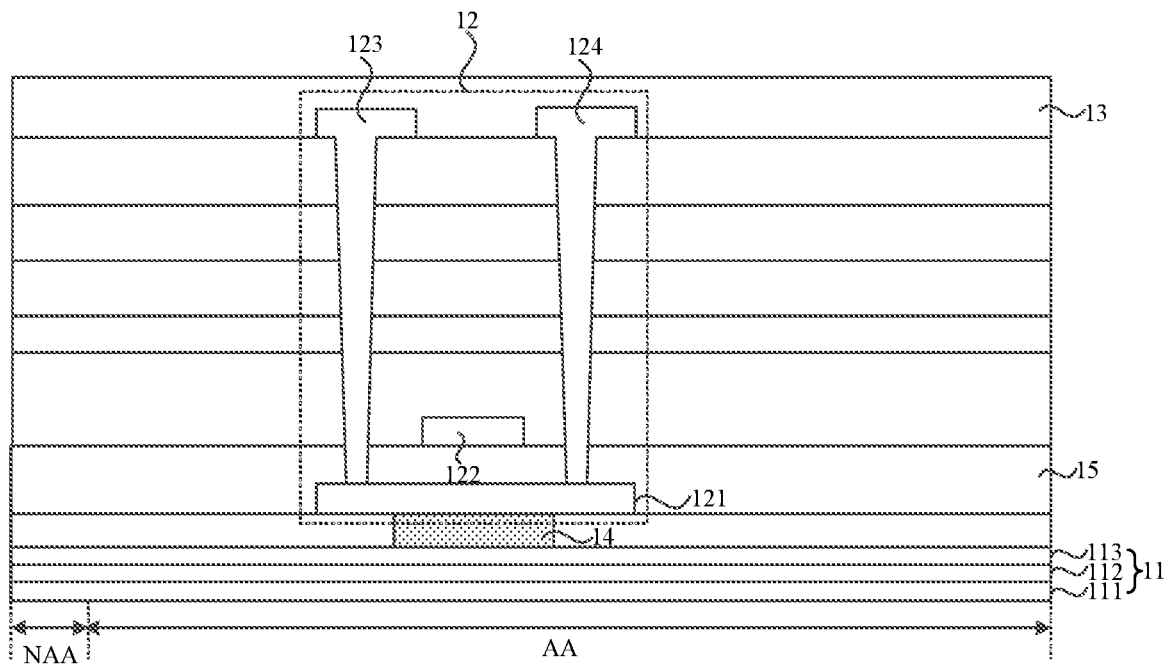
FIG. 2 is a structure view of another display panel according to an embodiment of the present disclosure.

FIG. 2 is a structure view of a display panel according to another embodiment of the present disclosure. As shown in FIG. 2, at least one insulating layer 15 and a first organic area 14 are provided between the film layer where the first active layer 121 is located and the base substrate 11, and an insulating layer in the first organic area 14 is made of organic material.

In an embodiment, the first organic area 14 is located between the film layer where the first active layer 121 is located and the base substrate 11, and the insulating layer in the first organic area 14 is made of organic material. Therefore, the first organic area 14 is disposed between the film layer where the first active layer 121 is located and the base substrate 11 so that the bendability of the display panel can be improved while the crack in the inorganic material can be blocked from spreading in the display area AA. It is to be noted that in the case where the base substrate 11 includes a flexible base substrate, the organic material in the first organic area 14 is different from the flexible base substrate and the first organic area 14 has a different structure from the flexible base substrate.

Figure 3:
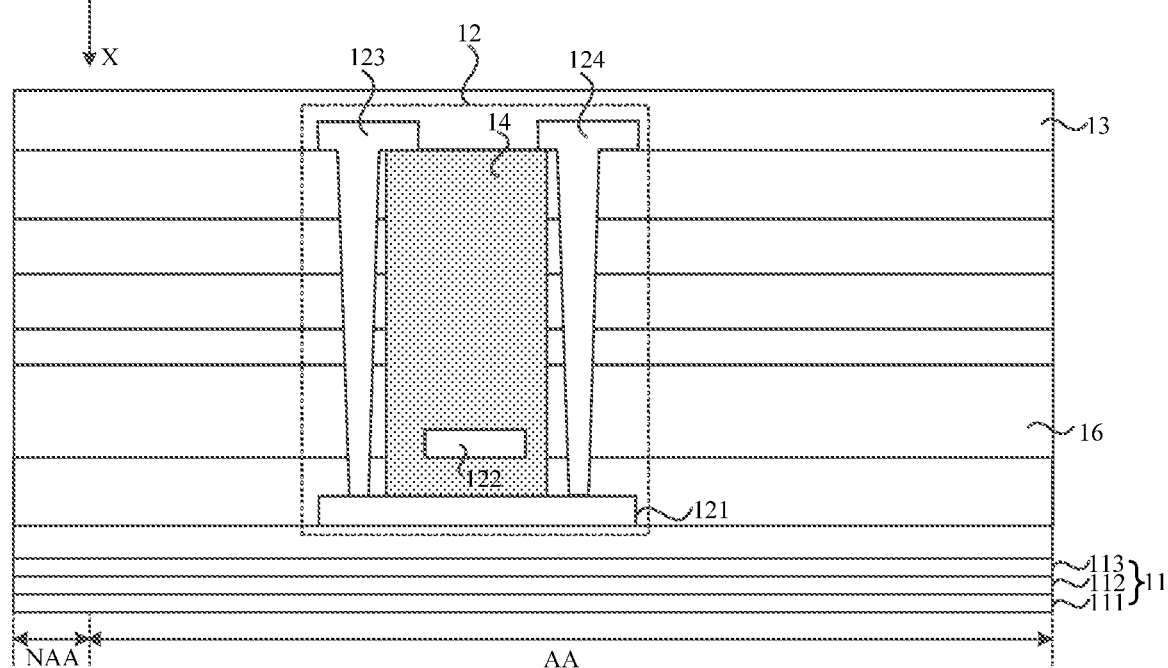
FIG. 3 is a structure view of another display panel according to an embodiment of the present disclosure.

FIG. 3 is a structure view of a display panel according to another embodiment of the present disclosure. As shown in FIG. 3, in the direction perpendicular to the base substrate 11, the first organic area 14 penetrates the insulating layer in contact with the first active layer 121, and the first organic area 14 is in contact with the planarization layer 13.

In the embodiment shown in FIG. 3, the first organic area 14 penetrates the insulating layer in contact with the first active layer 121, and the first organic area 14 is in contact with the planarization layer 13, that is, the first organic area 1 penetrates all the insulating layers between the planarization layer 13 and the first active layer 121 so that the bendability of the display panel can be fully improved, and the bendability of the display panel can be fully ensured. Moreover, the first organic area 1 penetrates all the insulating layers between the planarization layer 13 and the first active layer 121 so that the first organic area 14 can prevent the crack generated in any layer between the planarization layer 13 and the first active layer 121 from continuing to spread in the display area AA. In this manner, the good stability of the display panel can be ensured. Further, the first organic area 14 is disposed to be in contact with the planarization layer 13, and the planarization layer 13 and the first organic area 14 are prepared at the same time, so that it can be ensured that the display panel is simple in structure preparation process.

Referring to FIG. 1, at least one first inorganic area 16 is further provided between the film layer where the first active layer 121 is located and the planarization layer 13, and the insulating layer in the first inorganic area 16 is made of inorganic material.

In the shown in FIG. 1, due to the high compactness of the inorganic material and the high water-and-oxygen blocking property of the inorganic material, at least one first inorganic area 16 is disposed between the film layer where the first active layer 121 is located and the planarization layer 13, and the inorganic material is disposed in the first inorganic area 16. In this manner, film layers sensitive to water and oxygen are protected and isolated from water and oxygen through the inorganic material so that the film layers sensitive to water and oxygen are protected from water and oxygen corrosion, and thus it can be ensured that the film layers sensitive to water and oxygen have a stable performance, which further ensures the stable performance of the display panel.

Referring to FIG. 1, in the direction perpendicular to the base substrate 11 (the X direction as shown in the figure), the first inorganic area 16 is located between the film layer where the first active layer 121 is located and the first organic area 14, and at least one inorganic layer is provided between the first organic area 14 and the film layer where the first active layer 121 is located.

In an embodiment, the first inorganic area 16 is located between the film layer where the first active layer 121 is located and the first organic area 14, and the first active layer 121 is protected from water and oxygen through the first inorganic area 16. In this manner, it can be ensured that the first active layer 121 is protected from water and oxygen corrosion and the first active layer 121 has a stable performance, which further ensures the stable performance of the display panel.

Referring to FIG. 1, in the direction perpendicular to the base substrate 11 (the X direction as shown in the figure), the length of the first organic area 14 is H1, the sum of the thicknesses of the inorganic layers between the first organic area 14 and the film layer where the first active layer 121 is located is H2, and $H2 \geq \frac{1}{2} \times H1$.

In an embodiment, since the inorganic layer between the first organic area 14 and the film layer where the first active layer 121 is located can protect the first active layer 121 from water and oxygen, to ensure a high water and oxygen protection effect, the thicknesses of the inorganic layers between the first organic area 14 and the film layer where the first active layer 121 is located can be reasonably configured. For example, in the direction perpendicular to the base substrate 11 (the X direction as shown in the figure), the length H1 of the first organic area 14 and the sum H2 of the thicknesses of the inorganic layers between the first organic area 14 and the film layer where the first active layer 121 is located satisfy $H2 \geq \frac{1}{2} \times H1$. In this manner, the thicknesses of the inorganic layers between the first organic area 14 and the film layer where the first active layer 121 is located are not too thin, and the water and oxygen protection effect is good.

It is to be noted that the length H1 of the first organic area 14 and the sum H2 of the thicknesses of the inorganic layers between the first organic area 14 and the film layer where the first active layer 121 is located satisfy the condition $H2 \geq \frac{1}{2} \times H1$. Here only $\frac{1}{2}$ is used as an example for description. For example, the length H1 of the first organic area 14 and the sum H2 of the thicknesses of the inorganic layers between the first organic area 14 and the film layer where the first active layer 121 is located may satisfy the condition $H2 = \frac{2}{3} \times H1$, or $H2 = \frac{3}{4} \times H1$, and an embodiment of the present disclosure does not limit the specific value as long as it is ensured that the thicknesses of the inorganic layers between the first organic area 14 and the film layer where the first active layer 121 is located are not too thin and the water and oxygen protection effect is good.

Figure 4:
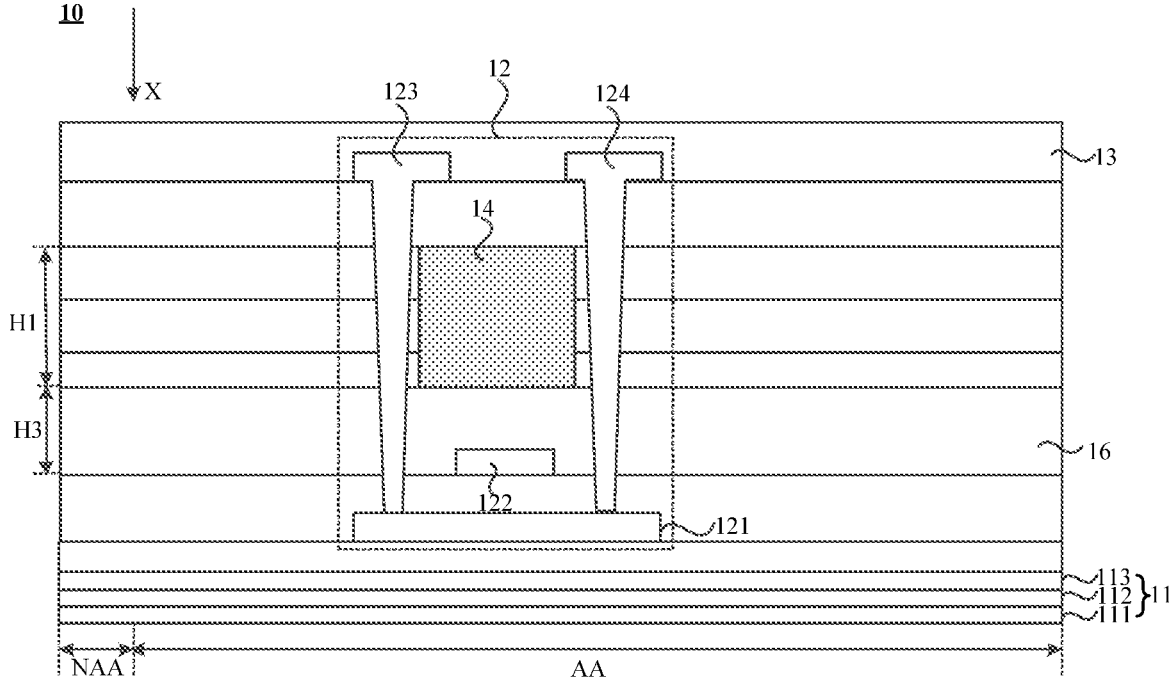
FIG. 4 is a structure view of another display panel according to an embodiment of the present disclosure.

FIG. 4 is a structure view of a display panel according to another embodiment of the present disclosure. As shown in FIG. 4, in the direction perpendicular to the base substrate 11 (the X direction as shown in the figure), the first inorganic area 16 is located between the film layer where the first gate 122 is located and the first organic area 14, and at least one inorganic layer is provided between the first organic area 14 and the film layer where the first gate 122 is located.

In an embodiment, the first inorganic area 16 is located between the film layer where the first gate 122 is located and the first organic area 14, and the first gate 122 is protected from water and oxygen through the first inorganic area 16. In this manner, it can be ensured that the first gate 122 is protected from water and oxygen corrosion and the first gate 122 has a stable performance, which further ensures the stable performance of the display panel.

In another embodiment, in the direction perpendicular to the base substrate 11 (the X direction as shown in the figure), the length of the first organic area 14 is H1, the sum of the thicknesses of the inorganic layers between the first organic area 14 and the film layer where the first gate 122 is located is H3, and $H3 \geq \frac{1}{2} \times H1$.

In an embodiment, since the inorganic layers between the first organic area 14 and the film layer where the first gate 122 is located can protect the first gate 122 from water and oxygen, to ensure a good water and oxygen protection effect, the thicknesses of the inorganic layers between the first organic area 14 and the film layer where the first gate 122 is located can be reasonably configured. For example, in the direction perpendicular to the base substrate 11 (the X direction as shown in the figure), the length H1 of the first organic area 14 and the sum H3 of the thicknesses of the inorganic layers between the first organic area 14 and the film layer where the first gate 122 is located satisfy the condition $H3 \geq \frac{1}{2} \times H1$. In this manner, the thicknesses of the inorganic layers between the first organic area 14 and the film layer where the first gate 122 is located are not too thin, and the water and oxygen protection effect is good.

It is noted that the length H1 of the first organic area 14 and the sum H3 of the thicknesses of the inorganic layers between the first organic area 14 and the film layer where the first gate 122 is located satisfy the condition $H3 \geq \frac{1}{2} \times H1$. Here only $\frac{1}{2}$ is used as an example for description. For example, the length H1 of the first organic area 14 and the sum H3 of the thicknesses of the inorganic layers between the first organic area 14 and the film layer where the first gate 122 is located may satisfy $H3 = \frac{2}{3} \times H1$, or $H3 = \frac{3}{4} \times H1$, and an embodiment of the present disclosure does not limit the specific value as long as it is ensured that the thicknesses of the inorganic layers between the first organic area 14 and the film layer where the first gate 122 is located are not too thin and the water and oxygen protection effect is good.

Figure 5:
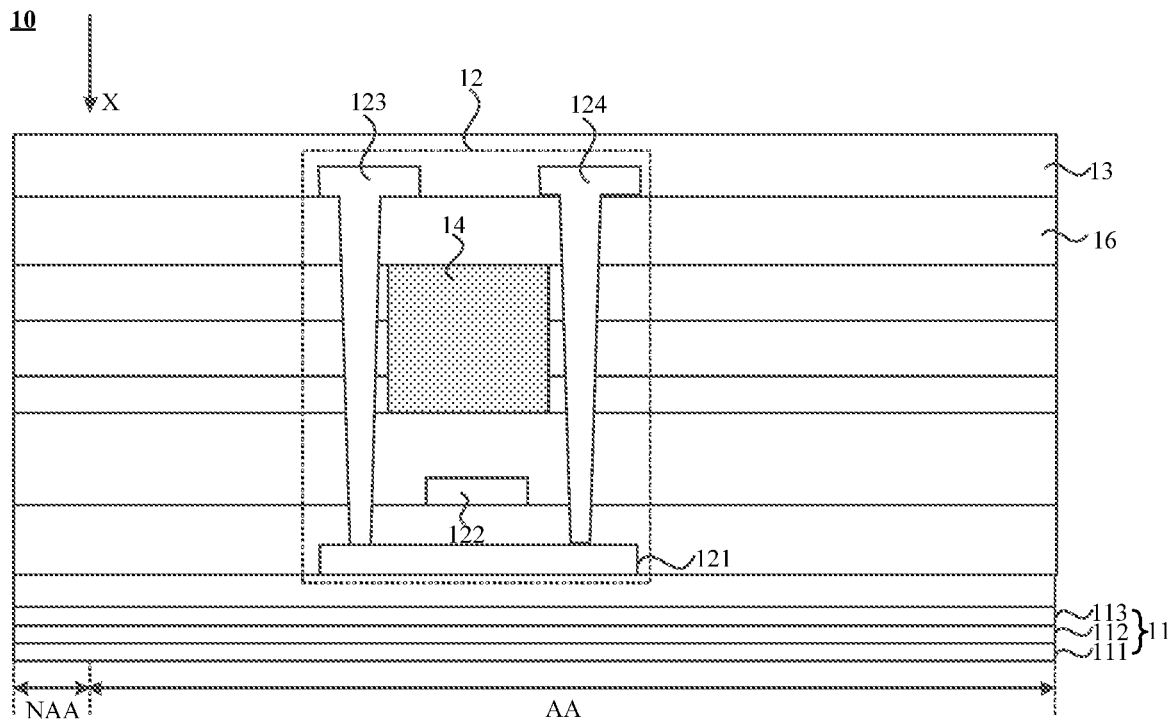
FIG. 5 is a structure view of another display panel according to an embodiment of the present disclosure.

FIG. 5 is a structure view of a display panel according to another embodiment of the present disclosure. As shown in FIG. 5, in the direction perpendicular to the base substrate 11 (the X direction as shown in the figure), the first inorganic area 16 is located between the first organic area 14 and the planarization layer 13, and at least one inorganic layer is provided between the first organic area 14 and the planarization layer 13.

In an embodiment, since the planarization layer 13 is generally prepared by using the organic material and the organic material is also provided in the first organic area 14, to avoid a decrease in the supporting capacity caused by excessive stacking of organic materials, the first inorganic area 16 may be disposed between the organic area 14 and the planarization layer 13, and the first inorganic area 16 includes at least one inorganic layer. In this manner, the good bendability of the display panel can be ensured and the good supporting effect of the display panel can be ensured, and thus the good stability of the display panel can be ensured comprehensively. In another embodiment, the first inorganic area 16 is located between the first organic area 14 and the planarization layer 13 so that the water and oxygen transmission channel between the planarization layer 13 and the first organic area 14 can be blocked, and thus water and oxygen are blocked in the planarization layer 13 and are prevented from further spreading into the first transistor 12. In this manner, it can be ensured that the first transistor 12 is protected from water and oxygen corrosion, and thus the stable performance of the first transistor 12 and the entire display panel can be ensured.

Figure 6:
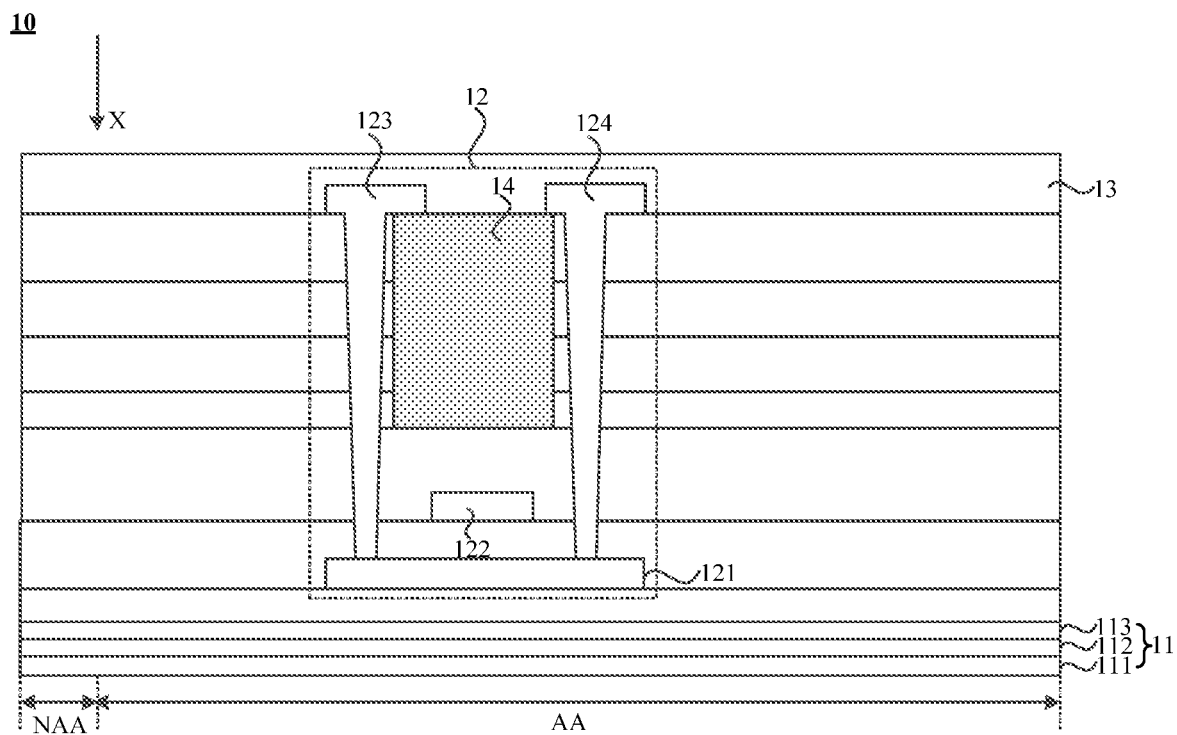
FIG. 6 is a structure view of another display panel according to an embodiment of the present disclosure.

FIG. 6 is a structure view of a display panel according to another embodiment of the present disclosure. As shown in FIG. 6, in the direction perpendicular to the base substrate 11 (the X direction as shown in the figure), the first organic area 14 is in contact with the planarization layer 13, and the organic material in the first organic area 14 includes the same material as the planarization layer 13.

In an embodiment, since the planarization layer 13 is generally prepared by using the organic material, and the organic material is also provided in the first organic area 14, to ensure that the organic material in the planarization layer 13 and the organic material in the first organic area 14 have a simple preparation process, the first organic area 14 is in contact with the planarization layer 13, and the organic material in the first organic area 14 includes the same material as the planarization layer 13. In this manner, the organic material in the planarization layer 13 and the organic material in the first organic area 14 can be prepared in the same process so that it can be ensured that the display panel has a simple preparation process.

Figure 7:
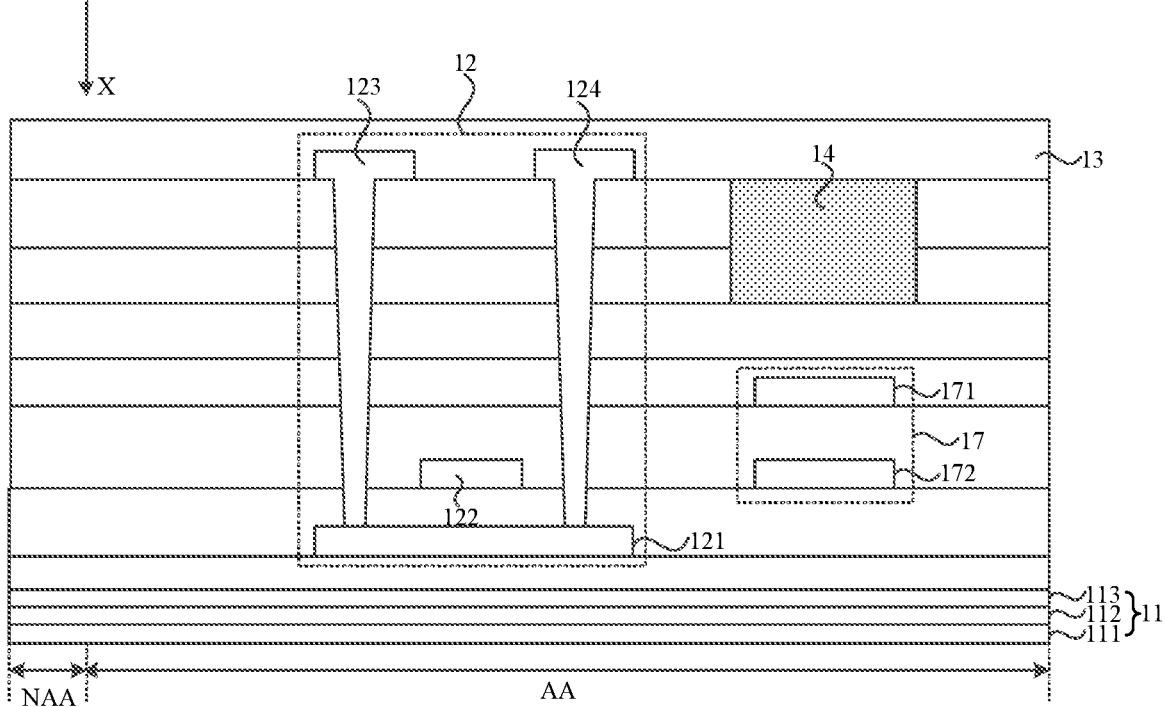
FIG. 7 is a structure view of another display panel according to an embodiment of the present disclosure.

FIG. 7 is a structure view of a display panel according to another embodiment of the present disclosure. As shown in FIG. 7, the display panel 10 may further include a first capacitor 17. The first capacitor 17 includes a first electrode plate 171 and a second electrode plate 172. In the direction perpendicular to the base substrate 11 (the X direction as shown in the figure), the first electrode plate 171 and the second electrode plate 172 are located between the planarization layer 13 and the film layer where the first active layer 121 is located, and the first electrode plate 171 is located on one side of the second electrode plate 172 facing away from the base substrate 11. The first organic area 14 is located between the first electrode plate 171 and the planarization layer 13, and at least one inorganic layer is provided between the first organic area 14 and the first electrode plate 171.

In an embodiment, the display panel 10 may further include a first capacitor 17. The first capacitor 17 may be a storage capacitor in a pixel circuit or may be an element in other structures. For example, the first capacitor 17 may be one capacitor structure in a gate drive circuit (not shown in the figure), and an embodiment of the present disclosure does not limit the specific existence form of the first capacitor 17. The first capacitor 17 includes a first electrode plate 171 and a second electrode plate 172. The first electrode plate 171 and the second electrode plate 172 are both located between the first active layer 121 and the planarization layer 13, the first organic area 14 is located between the first electrode plate 171 and the planarization layer 13, and at least one inorganic layer is provided between the first organic area 14 and the first electrode plate 171. In this manner, while the bendability of the display panel is improved, water and oxygen can be blocked through the at least one inorganic layer so that the first capacitor 17 can be protected from water and oxygen corrosion, the stable performance of the first capacitor 17 can be ensured, and thus it can be ensured that the overall performance of the display panel is stable.

Figure 8:
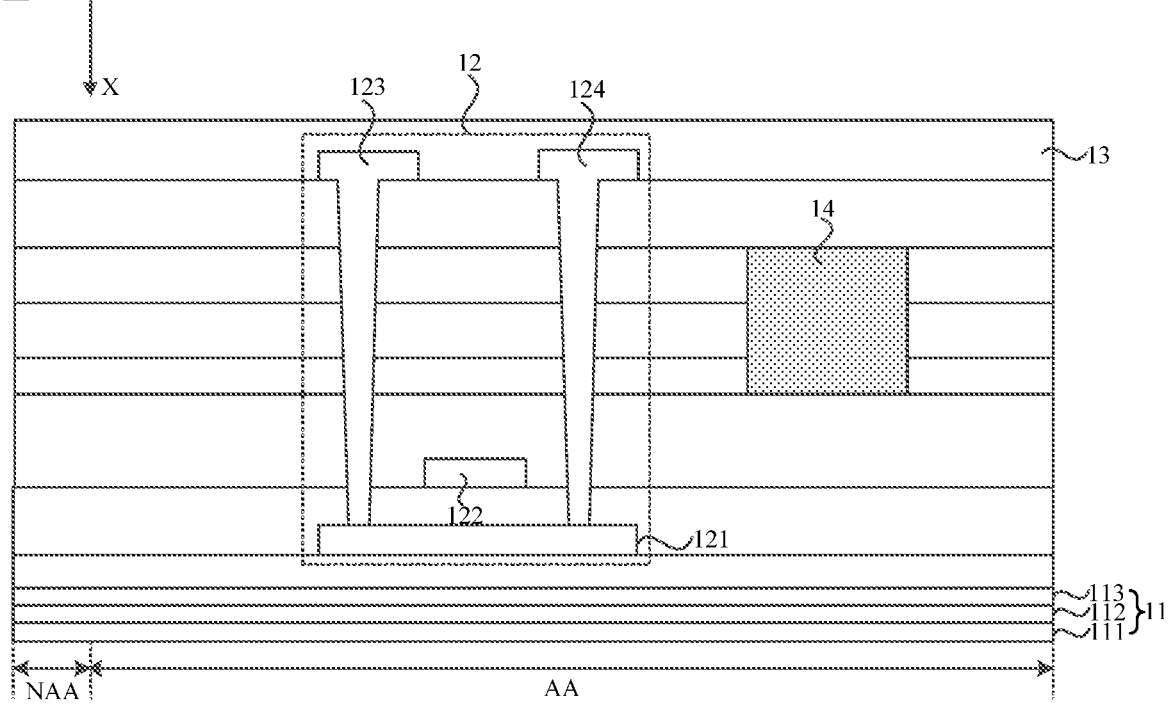
FIG. 8 is a structure view of another display panel according to an embodiment of the present disclosure.

FIG. 8 is a structure view of a display panel according to another embodiment of the present disclosure. As shown in FIG. 8, in the direction perpendicular to the base substrate 11, the first organic area 14 is located in an area outside the first transistor 12, and the first organic area 14 is not overlapped with the first transistor 12.

In the embodiment shown in FIG. 8, the direction perpendicular to the base substrate 11 is used as a projection direction, the first organic area 14 is located in an area outside the first transistor 12, that is, the vertical projection of the first organic area 14 on the plane where the base substrate 11 is located is not overlapped with the vertical projection of the first transistor 12 on the plane where the base substrate 11 is located. In this manner, on the one hand, the first organic area 14 is disposed so that the bendability of the display panel 10 can be enhanced; on the other hand, it can be ensured that the area where the first transistor 12 is located is protected from water and oxygen corrosion that may be caused by the first organic area 14, thereby improving the stability of the first transistor 12, ensuring the normal operation of the first transistor 12, and thereby ensuring the normal operation of the display panel. Further, the direction perpendicular to the base substrate 11 is used as a projection direction, the first organic area 14 is located in an area outside the first transistor 12, and the first organic area 14 is not overlapped with the first transistor 12. In this manner, the flexible positions and the diversified arrangements of the first organic area 14 can be ensured so that different design requirements can be satisfied.

In another embodiment, the direction perpendicular to the base substrate 11 is used as a projection direction, the first organic area 14 is located in an area outside the first transistor 12, and the first organic area 14 and the first transistor 12 can be disposed in various manners. For example, the organic area 14 may be disposed around the first transistor 12 (not shown in the figure), or the first organic area 14 may be located between the first transistor 12 and other transistors (not shown in the figure), which is not limited in an embodiment of the present disclosure as long as it is ensured that the vertical projection of the first organic area 14 on the plane where the base substrate 11 is located is not overlapped with the vertical projection of the first transistor 12 on the plane where the base substrate 11 is located and the first transistor 12 is protected from water and oxygen corrosion while the display panel has good bendability.

Figure 9:
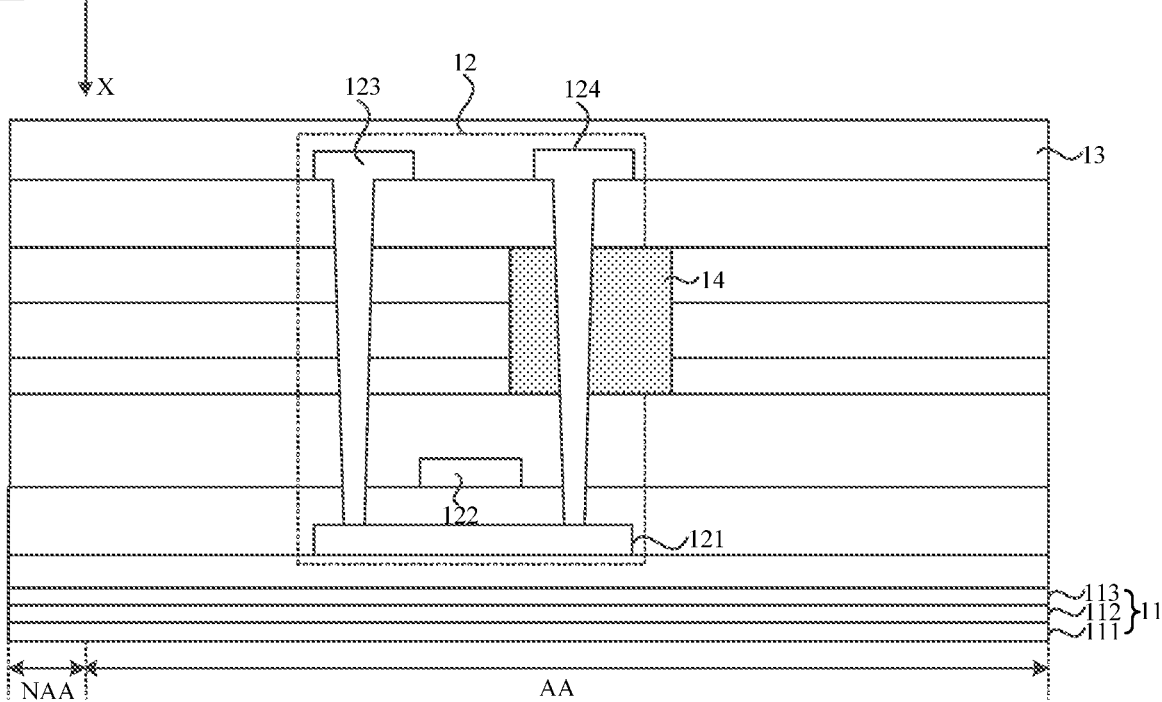
FIG. 9 is a structure view of another display panel according to an embodiment of the present disclosure.
Figure 10:
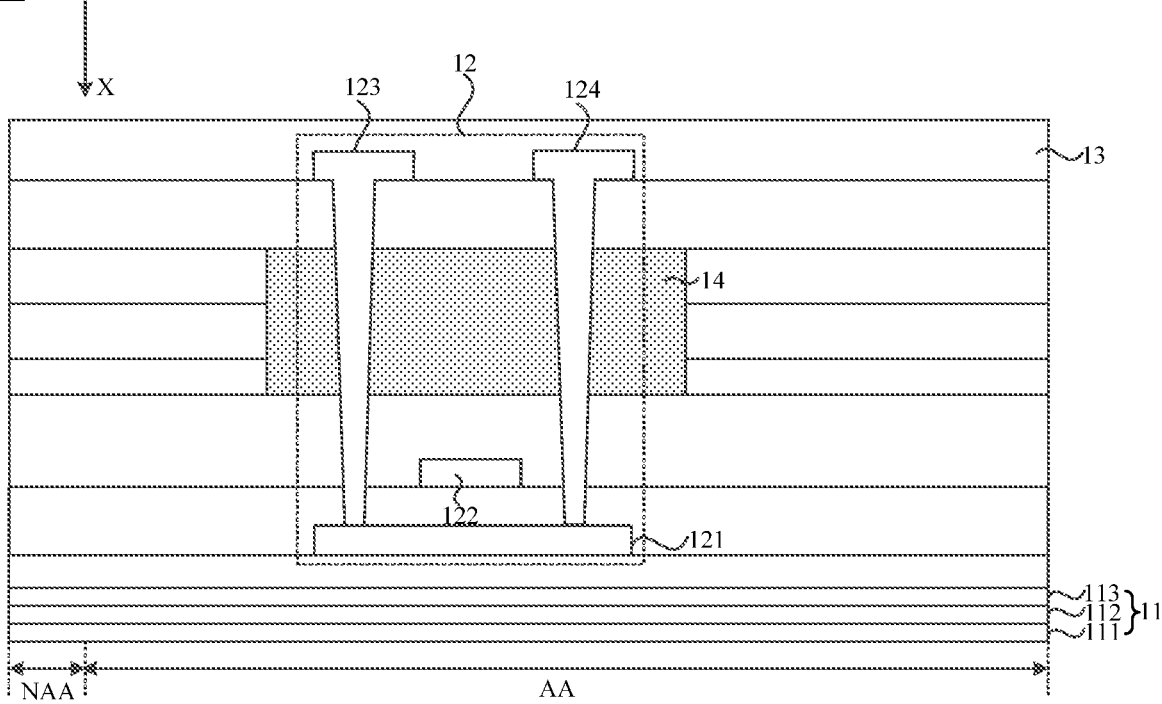
FIG. 10 is a structure view of another display panel according to an embodiment of the present disclosure.

FIG. 9 is a structure view of a display panel according to another embodiment of the present disclosure. FIG. 10 is a structure view of a display panel according to another embodiment of the present disclosure. In conjunction with FIG. 9 and FIG. 10, the direction perpendicular to the base substrate 11 is used as a projection direction, the first organic area 14 is overlapped with at least part of the first transistor 12.

As shown in FIG. 9 and FIG. 10, the direction perpendicular to the base substrate 11 is used as a projection direction, the first organic area 14 is at least partially overlapped with the first transistor 12, that is, the vertical projection of the first organic area 14 on the plane where the base substrate 11 is located is at least partially overlapped with the vertical projection of the first transistor 12 on the plane where the base substrate 11 is located. In this manner, on the one hand, the first organic area 14 is added so that the bendability of the display panel 10 is enhanced; on the other hand, at least part of the insulating layer inside the first transistor 12 can be made of organic material so that the bendability of the area where the first transistor 12 is located can be further improved, and thus the good bendability of the display panel can be ensured.

In an embodiment, the direction perpendicular to the base substrate 11 is used as a projection direction, the first organic area 14 is overlapped with at least part of the first transistor 12, which may be the cases described as follows: as shown in FIG. 9, the direction perpendicular to the base substrate 11 is used as a projection direction, and the first organic area 14 is overlapped with part of the first transistor 12; as shown in FIG. 10, the first organic area 14 is overlapped with the entire the first transistor 12, that is, the vertical projection of the first organic area 14 on the plane where the base substrate 11 is located covers the vertical projection of the first transistor 12 on the plane where the base substrate 11 is located. In this manner, in a direction perpendicular to the X direction shown in the figure, the area where the first transistor 12 is located has continuous organic materials so that the bendability of the area where the first transistor 12 is located can be further improved, and thus the good bendability of the display panel can be ensured.

Referring to FIG. 1, the direction perpendicular to the base substrate 11 is used as a projection direction, and the first organic area 14 is located in an area between the first source 123 and the first drain 124.

Referring to FIG. 1, the direction perpendicular to the base substrate 11 is used as a projection direction, and the first organic area 14 is located in an area between the first source 123 and the first drain 124. In this manner, while the good bendability of the area where the first transistor 12 is located can be ensured, the first organic area 14 does not affect the first source 123 and the first drain 124 so that the stable performance of the first source 123 and the first drain 124 can be ensured, and thus the stable performance of the first transistor 12 can be ensured, thereby ensuring the stable performance of the entire display panel.

Figure 11:
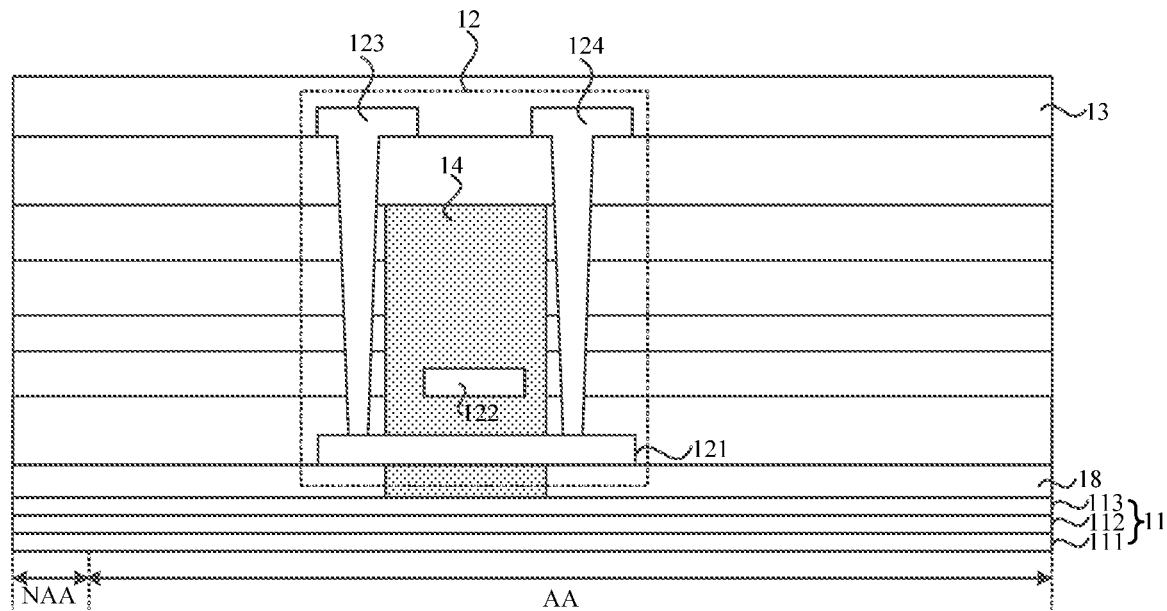
FIG. 11 is a structure view of another display panel according to an embodiment of the present disclosure.

FIG. 11 is a structure view of a display panel according to another embodiment of the present disclosure. As shown in FIG. 11, in the direction perpendicular to the base substrate 11, the first organic area 14 extends to the base substrate 11, the base substrate 11 is made of polyimide, and at least one organic layer is provided between the film layer where the first active layer 121 is located and the base substrate 11.

In the embodiment shown in FIG. 11, the display panel 10 may further include a buffer layer 18 located between the film layer where the base substrate 11 is located and the film layer where the first active layer 121 is located. The buffer layer 18 may be the insulating layer 15 in FIG. 2. In the direction perpendicular to the base substrate 11, the first organic area 14 extends to the base substrate 11, which may be understood as follows: at least part of the buffer layer 18 serves as part of the first organic area 14 and at least part of the buffer layer 18 is an organic layer. In this manner, the bendability of the display panel can be further improved, and the good bendability of the display panel can be ensured.

In another embodiment, the base substrate 11 may be a flexible base substrate, the base substrate 11 may include a polyimide substrate, and the base substrate 11 may include one layer of polyimide substrate or two layers of polyimide substrates, which is also not limited in an embodiment of the present disclosure. In FIG. 11, only the following case is described: the base substrate 11 is a flexible substrate and includes a first flexible substrate 111, a second flexible substrate 113, and an insulating layer 112 that is located between the first flexible substrate 111 and the second flexible substrate 113. The first flexible substrate 111 and the second flexible substrate 113 are made of polyimide. The insulating layer 112 may be the insulating layer between the first flexible substrate 111 and the second flexible substrate 113. Moreover, the organic material in the first organic area 14 is different from the flexible base substrate and the first organic area 14 has a different structure from the flexible base substrate. At least one organic layer is provided between the film layer where the first active layer 121 is located and the base substrate 11. In this manner, the bendability of the display panel can be fully improved, and the good bendability of the display panel can be ensured.

Figure 12:
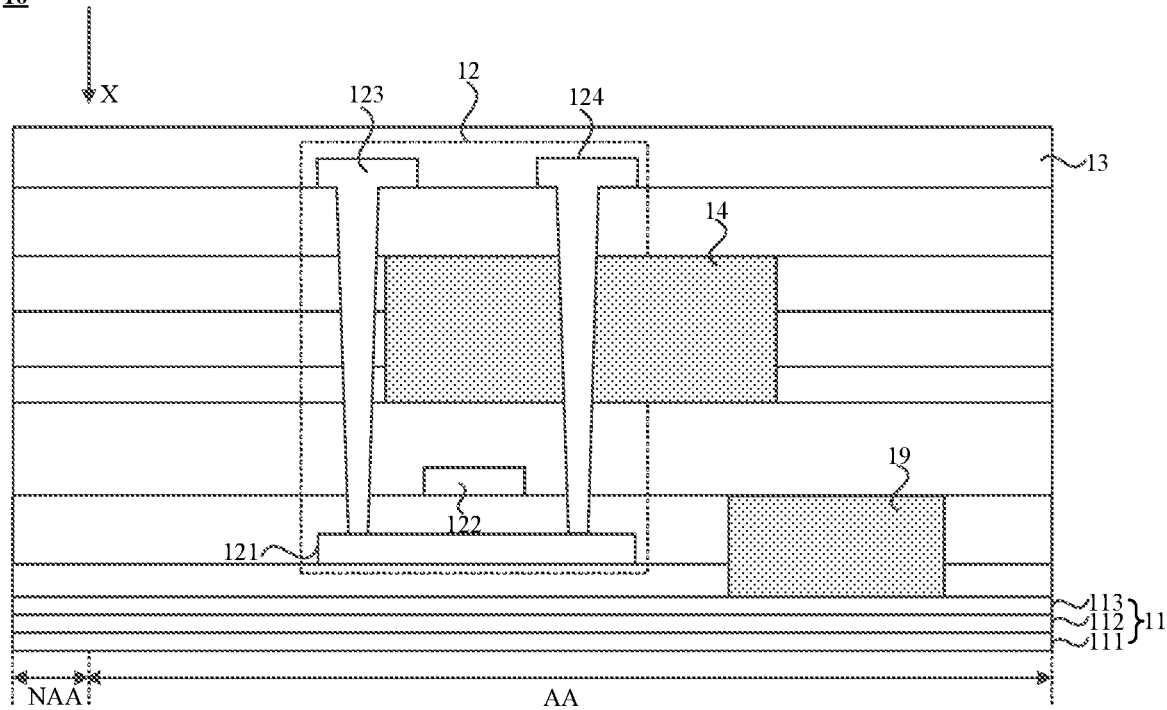
FIG. 12 is a structure view of another display panel according to an embodiment of the present disclosure.

FIG. 12 is a structure view of a display panel according to another embodiment of the present disclosure. As shown in FIG. 12, in the direction perpendicular to the base substrate 11 (the X direction as shown in the figure), a second organic area 19 is further provided between the base substrate 11 and the planarization layer 13, and the insulating layer in the second organic area 19 is made of organic material. In the direction perpendicular to the base substrate 11 (the X direction as shown in the figure), at least one inorganic layer is provided between the first organic area 14 and the second organic area 19.

In the shown in FIG. 12, the display panel 10 further includes, in part, a second organic area 19 located between the film layer where the base substrate 11 is located and the planarization layer 13, and the insulating layer in the second organic area 19 is made of organic material. Based on the first organic area 14, a second organic area 19 is added, and the first organic area 14 and the second organic area 19 cooperate to further improve the bendability of the display panel. Further, with continued reference to FIG. 12, since the organic material is disposed in the first organic area 14 and the organic material is disposed in the second organic area 19, to avoid a decrease in the supporting capacity caused by excessive stacking of organic materials, at least one inorganic layer may be provided between the first organic area 14 and the second organic area 19 in the direction perpendicular to the base substrate 11. In this manner, the good bendability of the display panel can be ensured and the good supporting effect of the display panel can be ensured, and thus the good stability of the display panel can be ensured comprehensively. Further, since at least one inorganic layer is disposed between the first organic area 14 and the second organic area 19 in the direction perpendicular to the base substrate 11 (the X direction as shown in the figure), the water and oxygen transmission channel between the first organic area 14 and the second organic area 19 can be blocked through the at least one inorganic layer so that the further transmission of water and oxygen in the display panel can be avoided, and thus the good water-and-oxygen blocking effect of the display panel can be ensured.

It is noted that in the direction perpendicular to the base substrate 11, the first organic area 14 may be overlapped with, or not overlapped with the second organic area 19, which will be specifically described in the embodiments below. Additionally, it is to be noted that the base substrate 11 may be a flexible base substrate such as a polyimide substrate, and the second organic area 19 and the flexible base substrate have different structures.

Referring to FIG. 12, the direction perpendicular to the base substrate 11 is used as a projection direction, and the first organic area 14 is at least partially overlapped with the second organic area 19.

As shown in FIG. 12, the direction perpendicular to the base substrate 11 is used as a projection direction, the first organic area 14 is at least partially overlapped with the second organic area 19, which may be understood as follows: the vertical projection of the first organic area 14 on the plane where the base substrate 11 is located is at least partially overlapped with the vertical projection of the second organic area 19 on the plane where the base substrate 11 is located. In this manner, the bendability of the display panel can be improved in the direction perpendicular to the base substrate 11 so that the good bendability of the display panel in the direction perpendicular to the base substrate 11 can be ensured.

Figure 13:
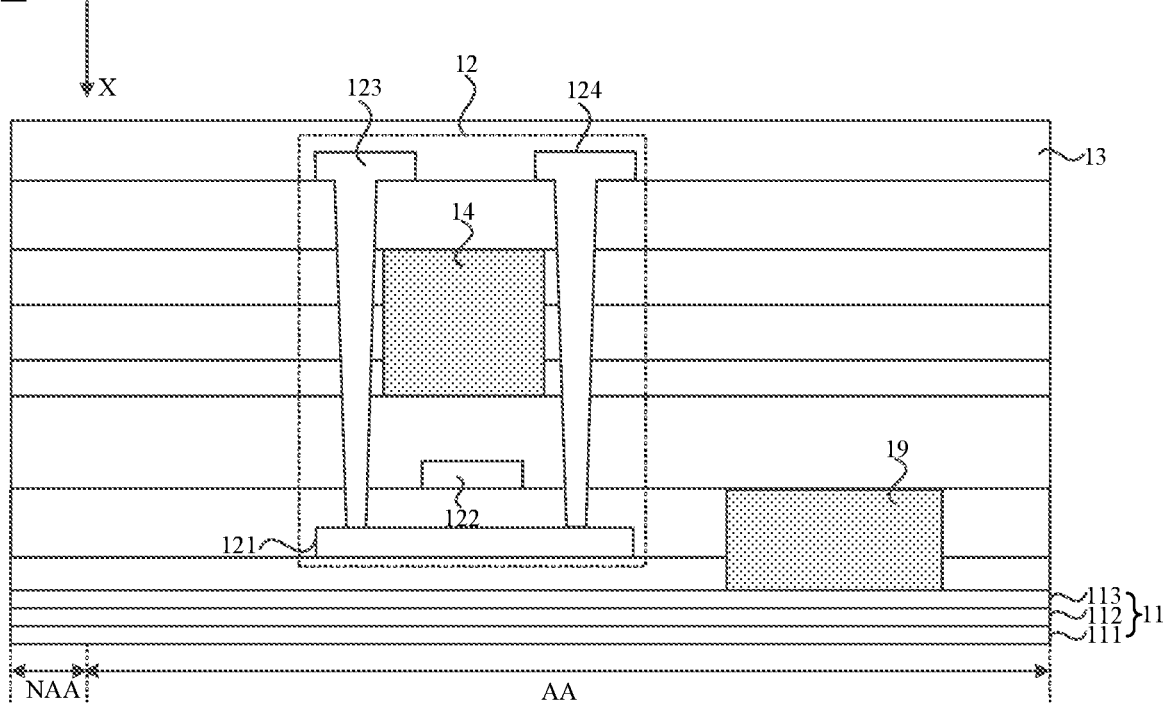
FIG. 13 is a structure view of another display panel according to an embodiment of the present disclosure.

FIG. 13 is a structure view of a display panel according to another embodiment of the present disclosure. As shown in FIG. 13, the direction perpendicular to the base substrate 11 is used as a projection direction, the first organic area 14 is not overlapped with the second organic area 19, and at least one of the first organic area 14 and the second organic area 19 is overlapped with at least part of the first transistor 12.

In the embodiment shown in FIG. 13, the direction perpendicular to the base substrate 11 is used as a projection direction, the first organic area 14 is not overlapped with the second organic area 19, which may be understood as follows: the vertical projection of the first organic area 14 on the plane where the base substrate 11 is located is not overlapped with the vertical projection of the second organic area 19 on the plane where the base substrate 11 is located. In this manner, the bendability of the display panel can be improved in the direction parallel to the plane where the base substrate 11 is located so that the good bendability of the display panel in the direction parallel to the plane where the base substrate 11 is located can be ensured.

In the embodiment shown in FIG. 13, at least one of the first organic area 14 and the second organic area 19 is overlapped with at least part of the first transistor 12. In FIG. 13, the case where the first organic area 14 is overlapped with at least part of the first transistor 12 is used as an example for description. In this manner, the bendability of the area where the first transistor 12 is located can be further improved, and thus the overall bendability of the display panel can be improved.

In an embodiment, the first organic area 14 and other structures in the display panel may be arranged in the same layer, penetrate the same film, and be prepared in the same process. How to configure the first organic area 14 will be described in detail below.

In an embodiment, the display panel may include a first conductive structure and a second conductive structure. At least one insulating layer is provided between the first conductive structure and the second conductive structure. The second conductive structure is located on one side of the first conductive structure facing toward the base substrate. The first conductive structure is connected to the second conductive structure through a via. In the direction perpendicular to the base substrate, the first organic area and the via penetrate (i.e., extend into) the same film layer.

In an embodiment, the display panel includes a first conductive structure and a second conductive structure that are arranged in different layers. The first conductive structure is electrically connected to the second conductive structure through a via hole. The via and the first organic area are implemented in the same mask process and penetrate the same film layer so that it can be ensured that the first organic area and the via have a simple preparation process and the preparation process is saved.

An example of how to configure the first organic area and the via is described in detail below.

Figure 14:
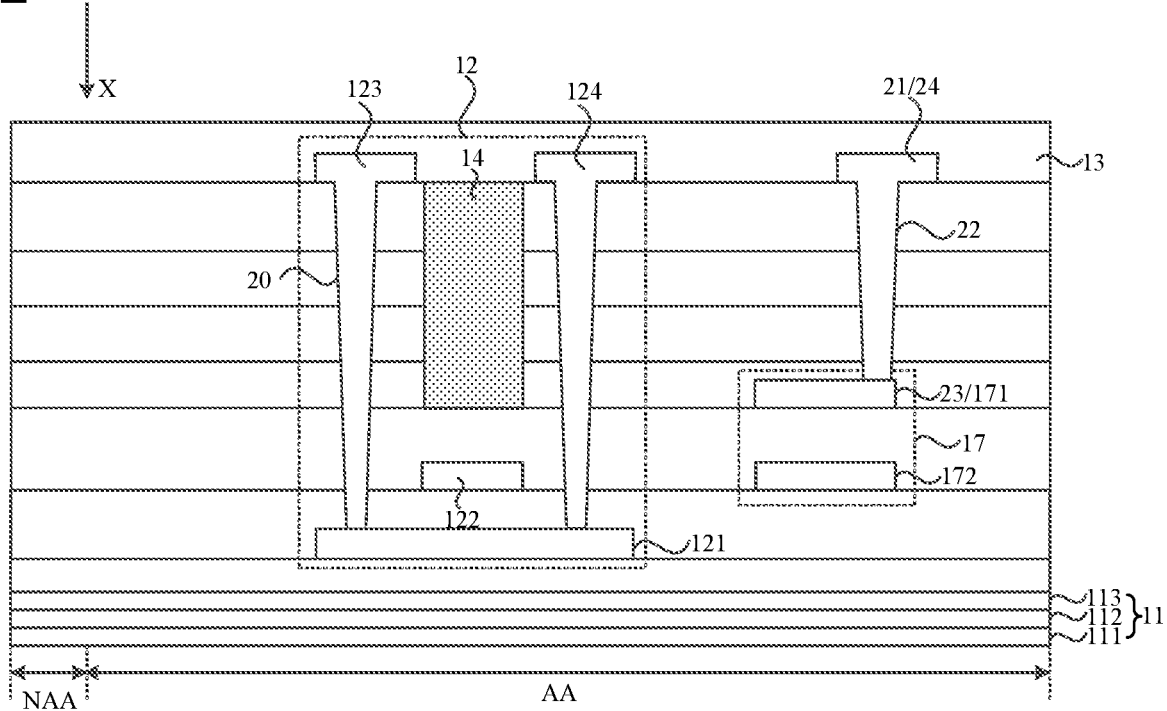
FIG. 14 is a structure view of another display panel according to an embodiment of the present disclosure.

FIG. 14 is a structure view of a display panel according to another embodiment of the present disclosure. As shown in FIG. 14, the first source 123 is connected to the first active layer 121 through a first via 20, and the first conductive structure 21 is electrically connected to the second conductive structure 23 through a second via 22. The depth of the second via 22 is less than the depth of the first via 20.

As shown in FIG. 14, the first source 123 is electrically connected to the first active layer 121 through the first via 20. The first via 20 may be a via with a relatively large depth, and the drilling process is difficult. The depth of the second via 22 electrically connecting the first conductive structure 21 with the second conductive structure 22 is less than the depth of the first via 20, so that the depth of the second via 22 is prevented from being relatively large and it can be ensured that the preparation process of the second via 22 is simple. Further, since the first conductive structure 21 is connected to the second conductive structure 23 through the second via 22, the second via 22 here is the preceding via that achieves the connection between the first conductive structure 21 and the second via 22. Since the first organic area 14 and the second via 22 penetrate the same film layers, the depth of the first organic area 14 can be prevented from being relatively large, and while it can be ensured that the second via 22 and the first organic area 14 have a simple preparation process and deep drilling is avoided, the problem of a decrease in the supporting capacity of the display panel due to the relatively deep first organic area 14 can be avoided and the simple preparation process and stable performance of the display panel can be ensured.

Display panel 10 shown in FIG. 14 further includes, in part, a first capacitor 17 that includes a first electrode plate 171 and a second electrode plate 172. In the direction perpendicular to the base substrate 11 (the X direction as shown in the figure), the first electrode plate 171 and the second electrode plate 172 are located between the planarization layer 13 and the film layer where the first active layer 121 is located, and the first electrode plate 171 is located on one side of the second electrode plate 172 facing away from the base substrate 11. The first conductive structure 21 is a first-electrode-plate connection line 24, and the second conductive structure 23 is the first electrode plate 17. The first-electrode-plate connection line 24 is configured to provide a voltage signal for the first electrode plate 171.

The display panel may further include a first capacitor 17. The first capacitor 17 may be, for example, a storage capacitor in a pixel circuit, and correspondingly, the first transistor 12 may be, for example, a switch transistor in a pixel circuit. The output terminal (source or drain) of the switch transistor is electrically connected to one of the electrode plates of the storage capacitor and writes a voltage signal to the storage capacitor. Correspondingly, in FIG. 14, the first-electrode-plate connection line 24 is electrically connected to the first source 123 or the first drain 124 of the first transistor 12 and electrically connected to the first electrode plate 171, so that the electrical connection between the first transistor 12 and the first capacitor 17 can be achieved, and the first transistor 12 can provide a voltage signal for the first electrode plate 171. In another embodiment, the first-electrode-plate connection line 24 is arranged in the same layer as the first source 123 and the first drain 124, the first-electrode-plate connection line 24 serves as the preceding first conductive structure 21, the first electrode plate 171 serves as the preceding second conductive structure 23, and the first-electrode-plate connection line 24 is electrically connected to the first electrode plate 171 through the second via 22. The first organic area 14 and the second via 22 penetrate the same film layers. In this manner, it can be ensured that the preparation process of the first organic area 14 matches the preparation process of the display panel and the preparation process of the first organic area 14 is simple.

Figure 15:
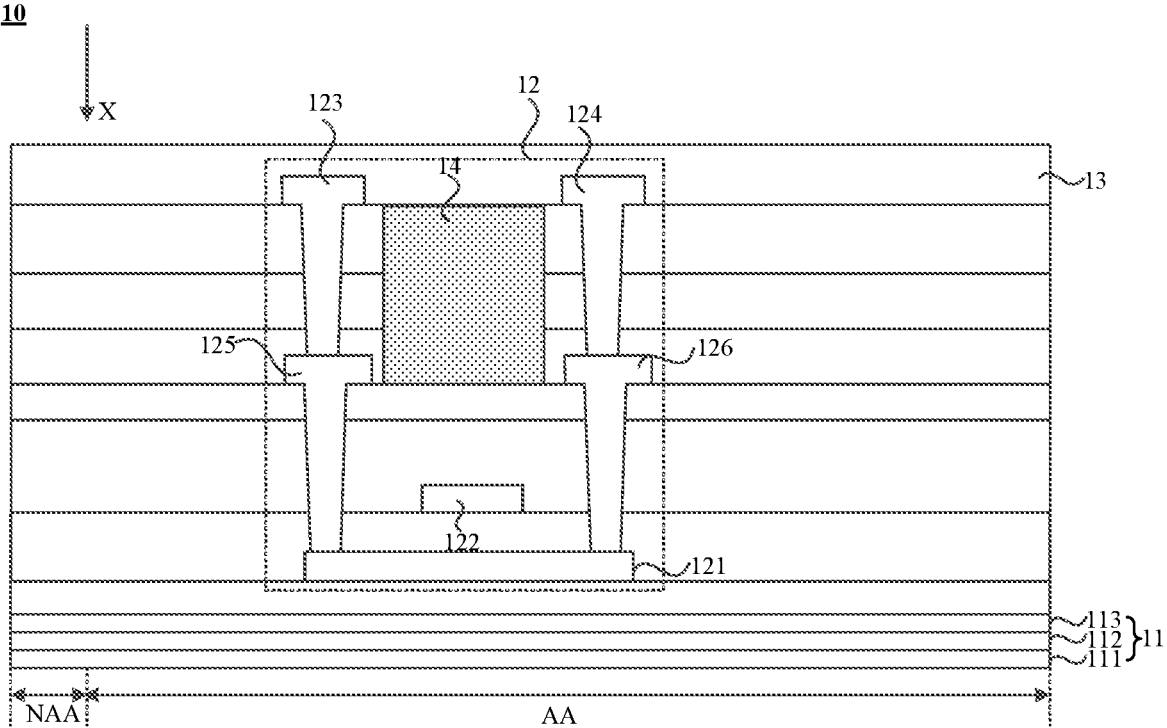
FIG. 15 is a structure view of another display panel according to an embodiment of the present disclosure.

FIG. 15 is a structure view of a display panel according to another embodiment of the present disclosure. As shown in FIG. 15, the first transistor 12 may further include a transition source 125 and a transition drain 126. The transition source 125 is located between the first source 123 and the first active layer 121. The transition drain 126 is located between the first drain 124 and the first active layer 121. The first source 123 is connected to the transition source 125 through one via. The transition source 125 is connected to the first active layer 121 through another via. The first drain 124 is connected to the transition drain 126 through one via. The transition drain 126 is connected to the first active layer 121 through another via. The first source 123 is a first conductive structure, and the transition source 125 is a second conductive structure; or the first drain 124 is a first conductive structure, and the transition drain 126 is a second conductive structure.

In an embodiment, in conjunction with FIG. 14 and FIG. 15, since the first source 123 and the first drain 124 are directly electrically connected to the first active layer 121 through the via, the depth of the via may be relatively large, and the preparation process of the via is complicated. In an embodiment of the present disclosure, the transition source 125 is added between the first source 123 and the first active layer 121, and the transition drain 126 is added between the first drain 124 and the first active layer 121. The first source 123 is connected to the transition source 125 through one via, and the transition source 125 is connected to the first active layer 121 through another via, so that the electrical connection between the first source 123 and the first active layer 121 can be achieved. The first drain 124 is connected to the transition drain 126 through one via, and the transition drain 126 is connected to the first active layer 121 through another via, so that the electrical connection between the first drain 124 and the first active layer 121 can be achieved. In this manner, the deep hole in the existing structure is replaced by two shallow holes so that the preparation process of the via can be simplified and the possible poor connection due to deep drilling can be avoided. In another embodiment, the first source 123 serves as the preceding first conductive structure 21, and the transition source 125 serves as the preceding second conductive structure 23, or the first drain 124 serves as the preceding first conductive structure 21, and the transition drain 126 serves as the preceding second conductive structure 23. The via connecting the first source 123 with the transition source 125 or the via connecting the first drain 124 with the transition drain 126 penetrates the same film layers as the first organic area 14 so that it can be ensured that the preparation process of the first organic area 14 matches the preparation process of the display panel and the preparation process of the first organic area 14 is simple.

Figure 16:
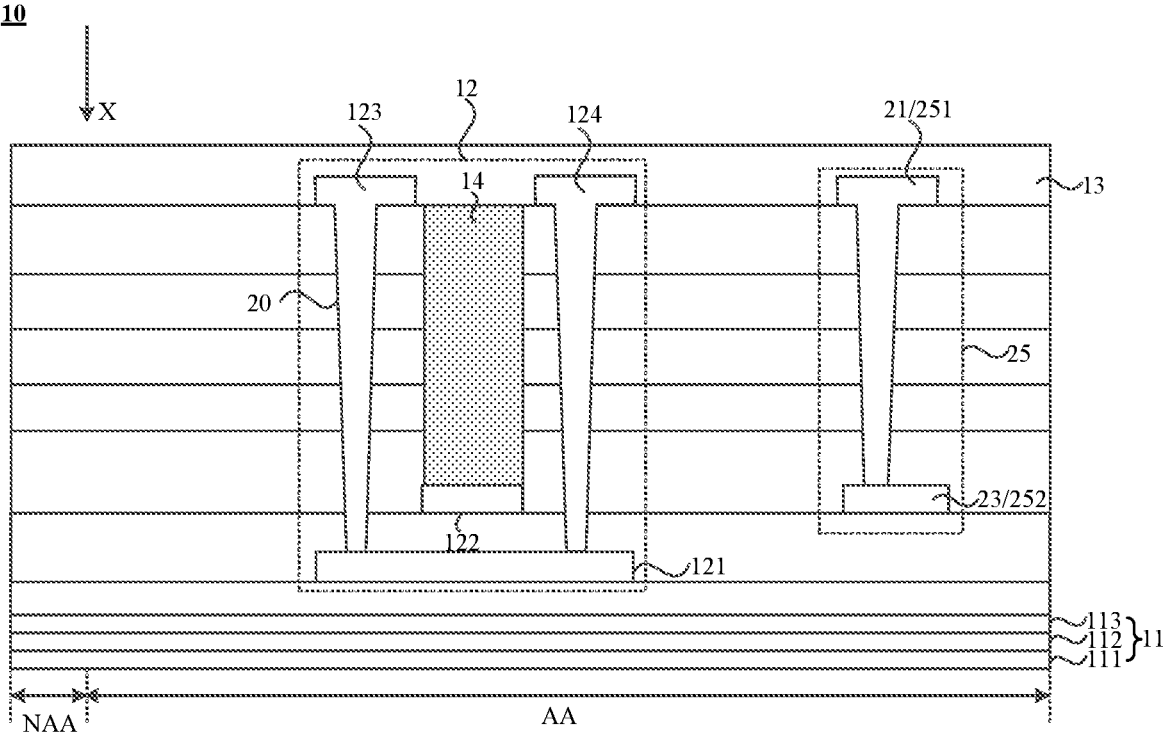
FIG. 16 is a structure view of another display panel according to an embodiment of the present disclosure.

FIG. 16 is a structure view of a display panel according to another embodiment of the present disclosure. As shown in FIG. 16, the display panel 10 includes a first signal line 25. The first signal line 25 includes a first sub-signal line 251 and a second sub-signal line 252 that are arranged in different layers and electrically connected to each other. The first sub-signal line 251 is connected to the second sub-signal line 252 through a via. The first sub-signal line 251 is the first conductive structure 21, and the second sub-signal line 252 is the second conductive structure 23.

In an embodiment, the display panel 10 provided in an embodiment of the present disclosure may further include a first signal line 25. The first signal line 25 may be, for example, a data signal line or a first power signal line. The first signal line 25 is configured to provide a data signal or a first power signal to the pixel circuit in the display panel. Since the display panel is provided with multiple components, to arrange various components reasonably, the first signal line 25 may be routed flexibly. In an embodiment, the first signal line 25 includes a first sub-signal line 251 and a second sub-signal line 252 that are arranged in different layers, and the first sub-signal line 251 is connected to the second sub-signal line 252 through a via. In this case, the first sub-signal line 251 may be the preceding first conductive structure 21, the second sub-signal line 252 may be the preceding second conductive structure 23, and the via connecting the first sub-signal line 251 with the second sub-signal line 252 penetrates the same film layers as the first organic area 14. In this manner, it can be ensured that the preparation process of the first organic area 14 matches the preparation process of the display panel and the preparation process of the first organic area 14 is simple.

It is noted that in FIG. 16, only the case where the first sub-signal line 251 and the first source 123 are arranged in the same layer, and the second sub-signal line 252 and the first gate 122 are arranged in the same layer is used as an example, which is not limited in an embodiment of the present disclosure. For example, in the case where the display panel includes a capacitor structure, the capacitor structure includes two electrode plates that are arranged in different layers, the first sub-signal line 251 may be arranged in the same layer as the first source 123, and the second sub-signal line 252 may be arranged in the same layer as one of the two electrode plates of the capacitor structure.

Figure 17:
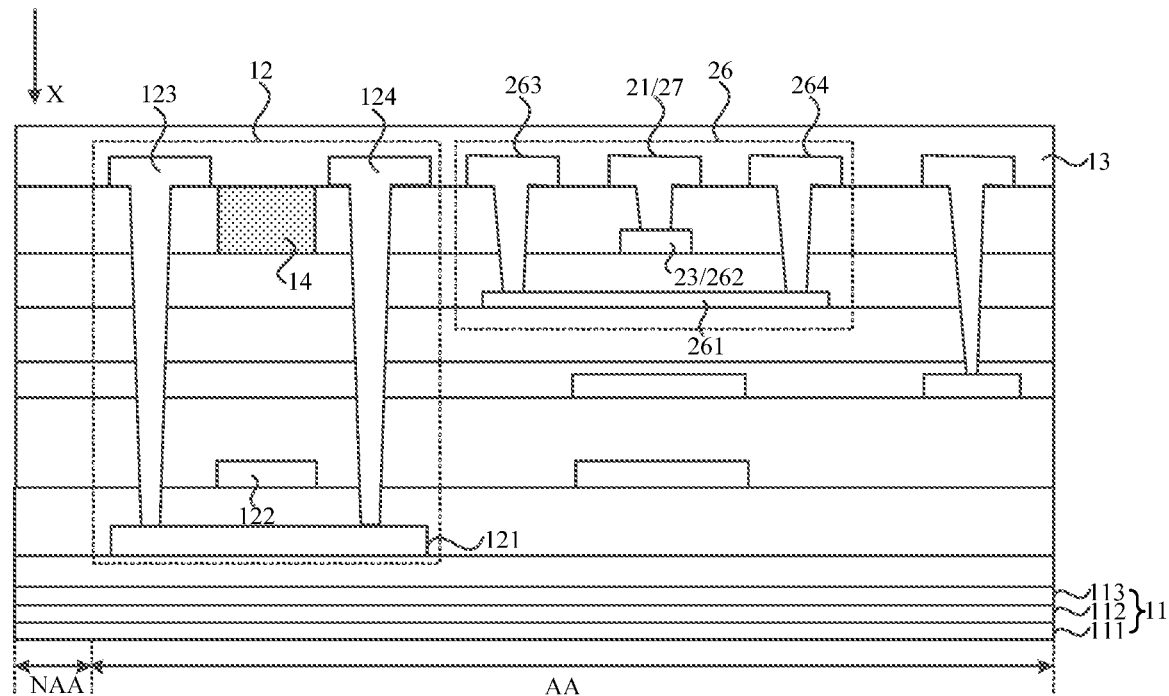
FIG. 17 is a structure view of another display panel according to an embodiment of the present disclosure.

FIG. 17 is a structure view of a display panel according to another embodiment of the present disclosure. As shown in FIG. 17, the display panel 10 may further include a second transistor 26. The second transistor 26 includes a second active layer 261, a second gate 262, a second source 263, and a second drain 264. The second active layer 261 is located on one side of the first active layer 121 facing away from the base substrate 11, and the second gate 262 is located on one side of the first active layer 121 facing away from the base substrate 11; the first active layer 121 includes silicon, and the second active layer 261 includes an oxide semiconductor.

In the shown in FIG. 17, the display panel 10 provided in an embodiment of the present disclosure may further include a second transistor 26, and the second transistor 26 and the first transistor 12 may be different types of transistors. In an embodiment, the second transistor 26 includes a second active layer 261, and the second active layer 261 may include an oxide semiconductor such as indium gallium zinc oxide (IGZO), The first active layer 121 may include silicon such as polycrystalline silicon or low-temperature polycrystalline silicon (LTPS), and the second transistor 26 and the first transistor 12 may be used together as a pixel circuit or as part of a pixel circuit, or the second transistor 26 and the first transistor 12 may be used together as part of a pixel drive circuit, which is not limited in an embodiment of the present disclosure. In an embodiment, the second transistor 26 may further include a second gate 262, a second source 263, and a second drain 264. The second source 263 and the second drain 264 are located on one side of the second gate 262 facing away from the base substrate 11. The second source 263 and the second drain 264 are electrically connected to the second active layer 261 through vias, respectively. In another embodiment, the second active layer 262 is located on one side of the first active layer 121 facing away from the base substrate 11. In this manner, the second active layer 261 can be protected from being damaged when the first active layer 121 is processed at a high temperature. In another embodiment, the second gate 262 is located on one side of the first active layer 121 facing away from the base substrate 11, and the second transistor 26 may be a top-gate structure and/or a bottom-gate structure, which is not limited in an embodiment of the present disclosure.

In an embodiment, in the case where the display panel 10 includes the first transistor 12 and the second transistor 26, in the direction perpendicular to the base substrate 11, the first organic area 14 is overlapped with the first transistor 12 and/or the second transistor 26. In this manner, the bendability of the area where the first transistor 12 and/or the second transistor 26 is located can be enhanced, the spread of the crack in the area where the first transistor 12 and/or the second transistor 26 is located can be prevented or slowed, and thus the good bendable display effect of the display panel can be achieved. Alternatively, the first organic area 14 is overlapped with neither the first transistor 12 nor the second transistor 26. In this manner, water vapor or oxygen in the first organic area 14 can be prevented from entering the first transistor 12 and the second transistor 26 so that the stable performance of the first transistor 12 and the second transistor 26 can be ensured, which further ensures the stable performance of the display panel 10.

Referring to FIG. 17, in the direction perpendicular to the base substrate 11 (the X direction as shown in the figure), the first organic area 14 is located on one side of the film layer where the second active layer 261 is located facing away from the base substrate 11, and at least one inorganic layer is provided between the first organic area 14 and the film layer where the second active layer 261 is located.

In an embodiment, as shown in FIG. 17, the second active layer 261 includes an oxide layer, the oxide layer is relatively sensitive to hydrogen ions, water vapor, and oxygen, and hydrogen ions, water vapor, and oxygen may affect the characteristics of the second active layer 261. Therefore, in the case where the first organic area 14 is located on one side of the film layer where the second active layer 261 is located facing away from the base substrate 11, at least one inorganic layer may be disposed between the first organic area 14 and the film layer where the second active layer 261 is located. The hydrogen ions, water vapor, and oxygen entering through the first organic area 14 can be blocked through the at least one inorganic layer. In this manner, while it can be ensured that the first organic area 14 increases the bendability of the display panel, it can be ensured that the second active layer 261 is protected from corrosion caused by hydrogen ions, water vapor, and oxygen, and the stable performance of the second active layer 261 can be ensured, thereby ensuring the stable functions of the second transistor 26 and the entire display panel.

Referring to FIG. 17, the display panel 10 may further include a second-gate connection line 27, the second-gate connection line 27 serves as the first conductive structure 21, and the second gate 262 serves as the second conductive structure 23. The second-gate connection line 27 is configured to provide a gate signal for the second gate 262.

In an embodiment, the first transistor 12 and the second transistor 26 may be used together as a pixel circuit or as part of a pixel circuit. For example, the first transistor 12 is a switch transistor, the second transistor 26 is a drive transistor, and the output terminal (source or drain) of the switch transistor is electrically connected to the gate of the drive transistor and writes a gate signal to the gate of the drive transistor. Correspondingly, in FIG. 18, the second-gate connection line 27 is electrically connected to the first source 123 or the first drain 124 of the first transistor 12 and electrically connected to the second gate 262 of the second transistor 26. In this manner, the electrical connection between the first transistor 12 and the second transistor 26 can be achieved, and a gate signal is provided to the second gate 262 through the first transistor 12. In another embodiment, the second-gate connection line 27 is arranged in the same layer as the first source 123 and the first drain 124, the second-gate connection line 27 serves as the preceding first conductive structure 21, the second gate 262 serves as the preceding second conductive structure 23, and the via that achieves the electrical connection between the second-gate connection line 27 and the second gate 262 penetrate the same film layers as the first organic area 14. In this manner, while it can be ensured that the first organic area 14 increases the bendability of the display panel, it can be ensured that the preparation process of the first organic area 14 matches the preparation process of the display panel and the preparation process of the first organic area 14 is simple.

In an embodiment, the via that achieves the electrical connection between the second-gate connection line 27 and the second gate 262 penetrates the same film layers as the first organic area 14. In this case, the first organic area 14 may be overlapped with the first transistor 12 and/or the second transistor 26, or the first organic area 14 is not overlapped with the first transistor 12 and the second transistor 26. In the case where the first organic area 14 is overlapped with the first transistor 12 and/or the second transistor 26, the bendability of the area where the first transistor 12 and/or the second transistor 26 is located can be enhanced, the spread of the crack in the area where the first transistor 12 and/or the second transistor 26 is located can be prevented or slowed, and thus the good bendable display effect of the display panel can be achieved. In the case where the first organic area 14 is overlapped with neither the first transistor 12 nor the second transistor 26, water vapor or oxygen in the first organic area 14 can be prevented from entering the first transistor 12 and the second transistor 26 so that the stable performance of the first transistor 12 and the second transistor 26 can be ensured, which further ensures the stable performance of the display panel 10. In FIG. 17, only the case where the first organic area 14 is overlapped with the first transistor 12 is used as an example for description.

Figure 18:
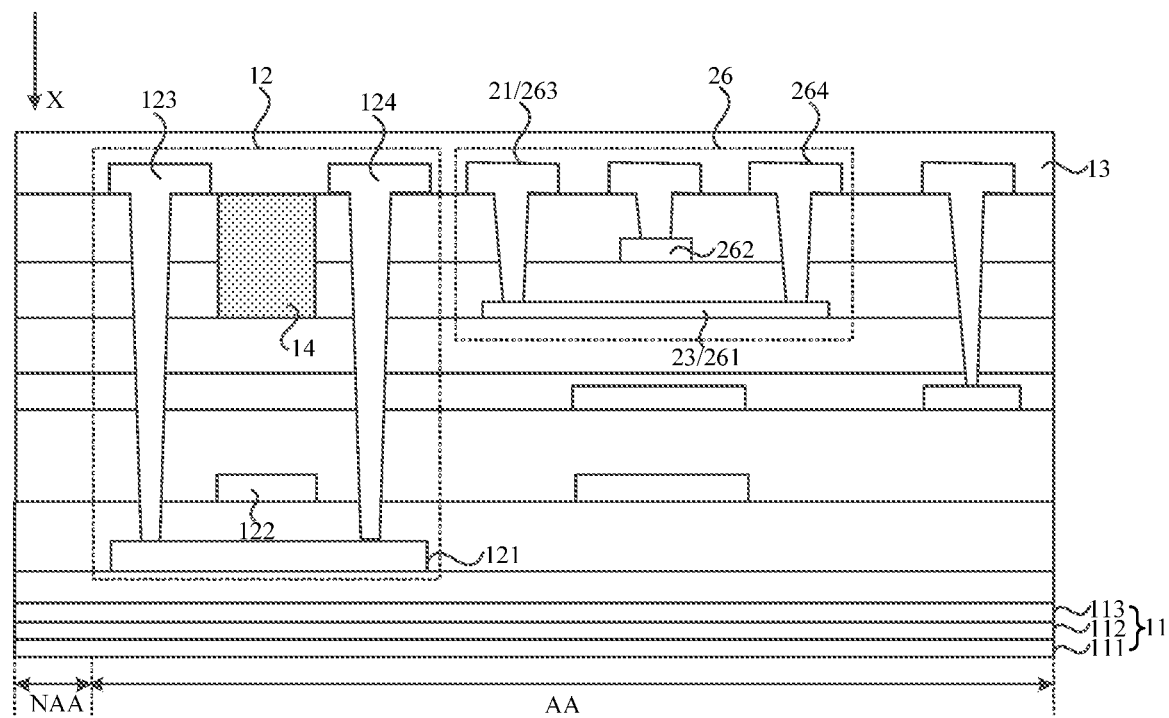
FIG. 18 is a structure view of another display panel according to an embodiment of the present disclosure.

FIG. 18 is a structure view of a display panel according to another embodiment of the present disclosure. As shown in FIG. 18, the second source 263 or the second drain 264 serves as the first conductive structure 21, and the second active layer 261 serves as the second conductive structure 23.

In an embodiment, the second source 263 and the second drain 264 need to be electrically connected to the second active layer 261 through vias. Therefore, the second source 263 or the second drain 264 may serve as the preceding first conductive structure 21, the second active layer 261 may serve as the preceding second conductive structure 23, and the via connecting the second source 263 with the second active layer 261 or the via connecting the second drain 264 with the second active layer 261 penetrates the same film layers as the first organic area 14, so that while it can be ensured that the first organic area 14 increases the bendability of the display panel, it can be ensured that the preparation process of the first organic area 14 matches the preparation process of the display panel, which ensures that the preparation process of the first organic area 14 is simple.

In another embodiment, the via connecting the second source 263 with the second active layer 261, or the via connecting the second drain 264 with the second active layer 261 penetrates the same film layers as the first organic area 14. In this case, the first organic area 14 may be overlapped with the first transistor 12, or the first organic area 14 may be overlapped with neither the first transistor 12 nor the second transistor 26. In the case where the first organic area 14 is overlapped with the first transistor 12, the bendability of the area where the first transistor 12 is located can be enhanced, the spread of the crack in the area where the first transistor 12 is located can be prevented or slowed, and thus the good bendable display effect of the display panel can be achieved. In the case where the first organic area 14 is overlapped with neither the first transistor 12 nor the second transistor 26, water vapor or oxygen in the first organic area 14 can be prevented from entering the first transistor 12 and the second transistor 26 so that the stable performance of the first transistor 12 and the second transistor 26 can be ensured, which further ensures the stable performance of the display panel 10. Further, since the second active layer 261 of the second transistor 26 is relatively sensitive to hydrogen ions, water vapor, and oxygen, in the case where the first organic area 14 is not overlapped with the second transistor 26, the first organic area 14 may be in direct contact with the second active layer 261 so that hydrogen ions, water vapor, and oxygen can be prevented from interfering with the second active layer 261, and thus the stable performance of the second transistor 26 and the entire display panel can be ensured.

Figure 19:
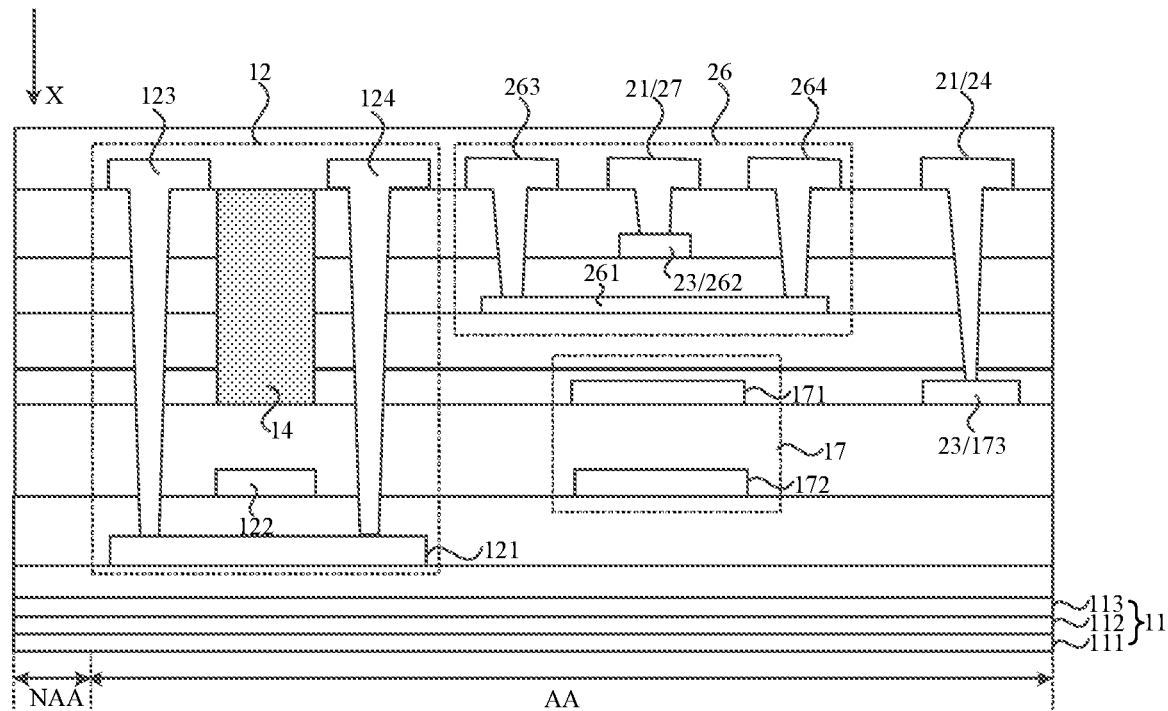
FIG. 19 is a structure view of another display panel according to an embodiment of the present disclosure.

FIG. 19 is a structure view of a display panel according to another embodiment of the present disclosure. As shown in FIG. 19, the display panel 10 further includes a first capacitor 17. The first capacitor 17 includes a first electrode plate 171 and a second electrode plate 172. In the direction perpendicular to the base substrate 11 (the X direction as shown in the figure), the first electrode plate 171 and the second electrode plate 172 are located between the planarization layer 13 and the film layer where the first active layer 121 is located, and the first electrode plate 171 is located on one side of the second electrode plate 172 facing away from the base substrate 11.

A first-electrode-plate connection line 24 serves as the first conductive structure 21, and a first-electrode-plate connection structure 173 serves as the second conductive structure 23. The first-electrode-plate structure 173 is electrically connected to the first electrode plate 171 (not shown in the figure); the first-electrode-plate connection line 24 is configured to provide a voltage signal for the first electrode plate 171.

In an embodiment, the display panel provided in an embodiment of the present disclosure may further include a first capacitor 17. The first capacitor 17 may be, for example, a storage capacitor in a pixel circuit, and correspondingly, the first transistor 12 may be, for example, a switch transistor in a pixel circuit. The output terminal (source or drain) of the switch transistor is electrically connected to one of the electrode plates of the storage capacitor and writes a voltage signal to the storage capacitor. Correspondingly, in FIG. 19, the first-electrode-plate connection line 24 is electrically connected to the first source 123 or the first drain 124 of the first transistor 12 and electrically connected to the first-electrode-plate connection structure 173, and the first-electrode-plate connection structure 173 is electrically connected to the first electrode plate 171 (not shown in the figure), so that the electrical connection between the first transistor 12 and the first capacitor 17 can be achieved, and a voltage signal is provided to the first electrode plate 171 through the first transistor 12. In another embodiment, the first-electrode-plate connection line 24 is arranged in the same layer as the first source 123 and the first drain 124, the first-electrode-plate connection line 24 serves as the preceding first conductive structure 21, the first-electrode-plate connection structure 173 serves as the preceding second conductive structure 23, and the via connecting the first-electrode-plate connection line 24 with the first-electrode-plate connection structure 173 penetrates the same film layer as the first organic area 14. In this manner, while it can be ensured that the first organic area 14 increases the bendability of the display panel, it can be ensured that the preparation process of the first organic area 14 matches the preparation process of the display panel and the preparation process of the first organic area 14 is simple.

In an embodiment, the via connecting the first-electrode-plate connection line 24 with the first-electrode-plate connection structure 173 penetrates the same film layers as the first organic area 14. In this case, the first organic area 14 may be overlapped with the first transistor 12, or the first organic area 14 is overlapped with neither the first transistor 12 nor the second transistor 26. In the case where the first organic area 14 is overlapped with the first transistor 12, the bendability of the area where the first transistor 12 is located can be enhanced, the spread of the crack in the area where the first transistor 12 is located can be prevented or slowed, and thus the good bendable display effect of the display panel can be achieved. In the case where the first organic area 14 is overlapped with neither the first transistor 12 nor the second transistor 26, water vapor or oxygen in the first organic area 14 can be prevented from entering the first transistor 12 and the second transistor 26 so that the stable performance of the first transistor 12 and the second transistor 26 can be ensured, which further ensures the stable performance of the display panel 10. Further, since the second active layer 261 of the second transistor 26 is relatively sensitive to hydrogen ions, water vapor, and oxygen, in the case where the first organic area 14 is not overlapped with the second transistor 26, the first organic area 14 can be prevented from penetrating the second active layer 261 so that hydrogen ions, water vapor, and oxygen can be prevented from interfering with the second active layer 261, and thus the stable performance of the second transistor 26 and the entire display panel can be ensured.

Figure 20:
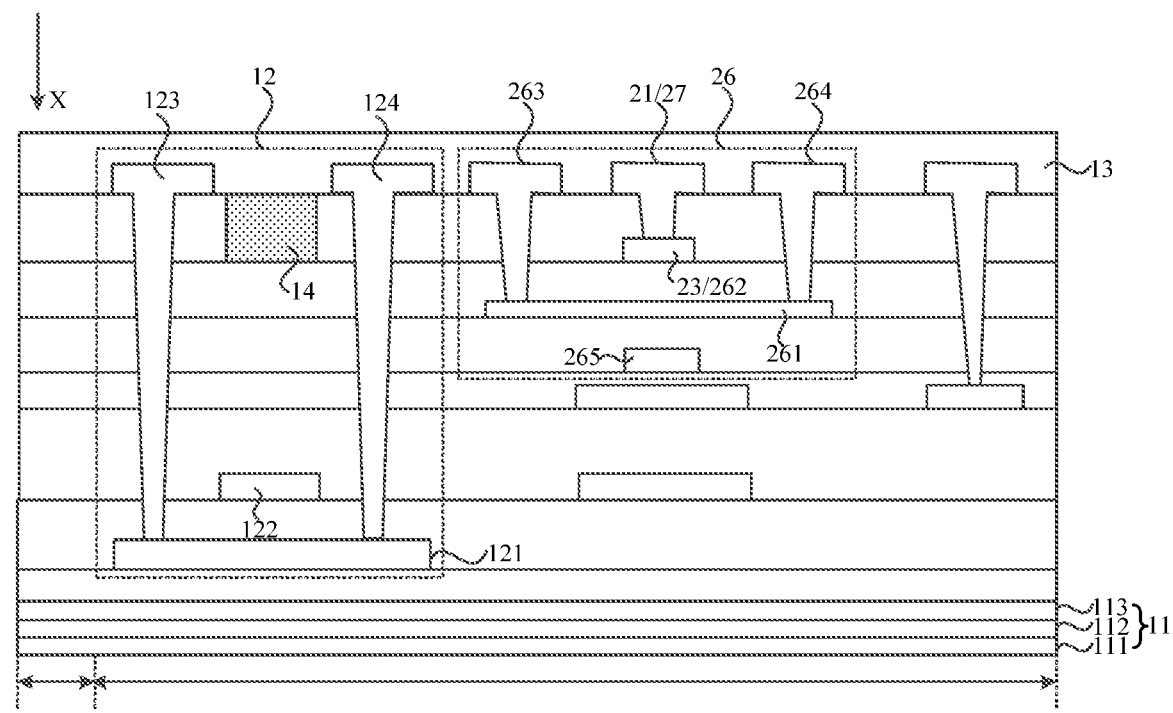
FIG. 20 is a structure view of another display panel according to an embodiment of the present disclosure.
Figure 21:
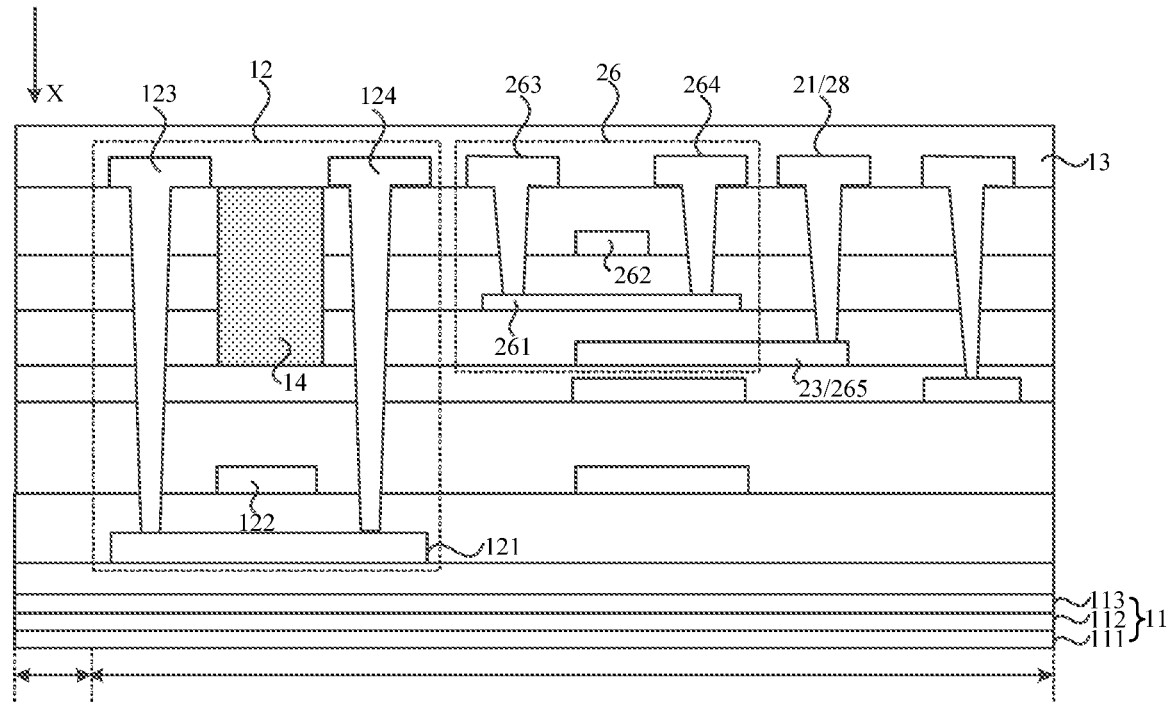
FIG. 21 is a structure view of another display panel according to an embodiment of the present disclosure.

FIG. 20 is a structure view of a display panel according to another embodiment of the present disclosure, and FIG. 21 is a structure view of a display panel according to yet another embodiment of the present disclosure. In conjunction with FIG. 20 and FIG. 21, in the display panel 10 provided in an embodiment of the present disclosure, the second transistor 26 may further include a third gate 265. The second gate 262 is located on one side of the second active layer 261 facing away from the base substrate 11. The third gate 265 is located on one side of the second active layer 261 facing toward the base substrate 11. The second-gate connection line 27 serves as the first conductive structure 21, the second gate 262 serves as the second conductive structure 23, and the second-gate connection line 27 is configured to provide a gate signal for the second gate 262 (as shown in FIG. 20). Alternatively, a third-gate connection line 28 serves as the first conductive structure 21, the third gate 265 serves as the second conductive structure 23, and the third-gate connection line 28 is configured to provide a gate signal for the third gate 265.

In an embodiment, the second transistor 26 is an oxide semiconductor transistor, and the second transistor 26 is generally a double-gate transistor. Since the volume of the second transistor 26 is relatively large, to reduce the volume of the second transistor 26, the second transistor 26 may be set as a double-gate transistor with a top-gate structure and a bottom-gate structure. As shown in FIG. 20 and FIG. 21, the second transistor 26 may further include a third gate 265, the second gate 262 is located on one side of the second active layer 261 facing away from the base substrate 11 and serves as the top gate of the second transistor 26, and the third gate 265 is located on one side of the second active layer 261 facing toward the base substrate 11 and serves as the bottom gate of the second transistor 26. In this manner, the double-gate structure design of the second transistor 26 can be achieved. As described above, the first transistor 21 serves as a switch transistor, and the second transistor 26 serves as a drive transistor. The output terminal (source or drain) of the switch transistor is electrically connected to the gate of the drive transistor and writes a gate signal to the gate of the drive transistor. In conjunction with the double-gate structure design of the second transistor 26, the output terminal of the first transistor 21 may be electrically connected to the second gate 262 of the second transistor 26, or the output terminal of the first transistor 21 may be electrically connected to the third gate 265 of the second transistor 26. In an embodiment, as shown in FIG. 20, the second-gate connection line 27 is arranged in the same layer as the first source 123 and the first drain 124, the second-gate connection line 27 serves as the preceding first conductive structure 21, the second gate 262 serves as the preceding second conductive structure 23, and the via that achieves the electrical connection between the second-gate connection line 27 and the second gate 262 penetrates the same film layers as the first organic area 14. In this manner, while it can be ensured that the first organic area 14 increases the bendability of the display panel, it can be ensured that the preparation process of the first organic area 14 matches the preparation process of the display panel and the preparation process of the first organic area 14 is simple. Alternatively, as shown in FIG. 21, the third-gate connection line 28 is arranged in the same layer as the first source 123 and the first drain 124, the third-gate connection line 28 serves as the preceding first conductive structure 21, the third gate 265 serves as the preceding second conductive structure 23, and the via that achieves the electrical connection between the third-gate connection line 28 and the third gate 265 penetrate the same film layers as the first organic area 14. In this manner, while it can be ensured that the first organic area 14 increases the bendability of the display panel, it can be ensured that the preparation process of the first organic area 14 matches the preparation process of the display panel and the preparation process of the first organic area 14 is simple.

In an embodiment, the via that achieves the electrical connection between the second-gate connection line 27 and the second gate 262 penetrates the same film layers as the first organic area 14. In this case, the first organic area 14 may be overlapped with the first transistor 12 and/or the second transistor 26, or the first organic area 14 is overlapped with neither the first transistor 12 nor the second transistor 26. In the case where the first organic area 14 is overlapped with the first transistor 12 and/or the second transistor 26, the bendability of the area where the first transistor 12 and/or the second transistor 26 is located can be enhanced, the spread of the crack in the area where the first transistor 12 and/or the second transistor 26 is located can be prevented or slowed, and thus the good bendable display effect of the display panel can be achieved. In the case where the first organic area 14 is overlapped with neither the first transistor 12 nor the second transistor 26, water vapor or oxygen in the first organic area 14 can be prevented from entering the first transistor 12 and the second transistor 26 so that the stable performance of the first transistor 12 and the second transistor 26 can be ensured, which further ensures the stable performance of the display panel 10. In FIG. 20, only the case where the first organic area 14 is overlapped with the first transistor 12 is used as an example for description. In another embodiment, the via that achieves the electrical connection between the third-gate connection line 28 and the third gate 265 penetrates the same film layers as the first organic area 14. In this case, the first organic area 14 may be overlapped with the first transistor 12, or the first organic area 14 is overlapped with neither the first transistor 12 nor the second transistor 26. In the case where the first organic area 14 is overlapped with the first transistor 12, the bendability of the area where the first transistor 12 is located can be enhanced, the spread of the crack in the area where the first transistor 12 is located can be prevented or slowed, and thus the good bendable display effect of the display panel can be achieved. In the case where the first organic area 14 is overlapped with neither the first transistor 12 nor the second transistor 26, water vapor or oxygen in the first organic area 14 can be prevented from entering the first transistor 12 and the second transistor 26 so that the stable performance of the first transistor 12 and the second transistor 26 can be ensured, which further ensures the stable performance of the display panel 10. In FIG. 21, only the case where the first organic area 14 is overlapped with the first transistor 12 is used as an example for description. Further, since the second active layer 261 of the second transistor 26 is relatively sensitive to hydrogen ions, water vapor, and oxygen, in the case where the first organic area 14 is not overlapped with the second transistor 26, the first organic area 14 can be prevented from penetrating the second active layer 261 so that hydrogen ions, water vapor, and oxygen can be prevented from interfering with the second active layer 261, and thus the stable performance of the second transistor 26 and the entire display panel can be ensured.

The above embodiment describe the case where the first organic area 12 and other structures in the display panel are arranged in the same layer, penetrate the same film layers, and are prepared in the same process. The above embodiments are merely exemplary descriptions and do not limit embodiments of the present disclosure. The other case where the first organic area 12 penetrates the same film layers as other structures in the display panel is also provided in the scope of embodiments of the present disclosure.

Figure 22:
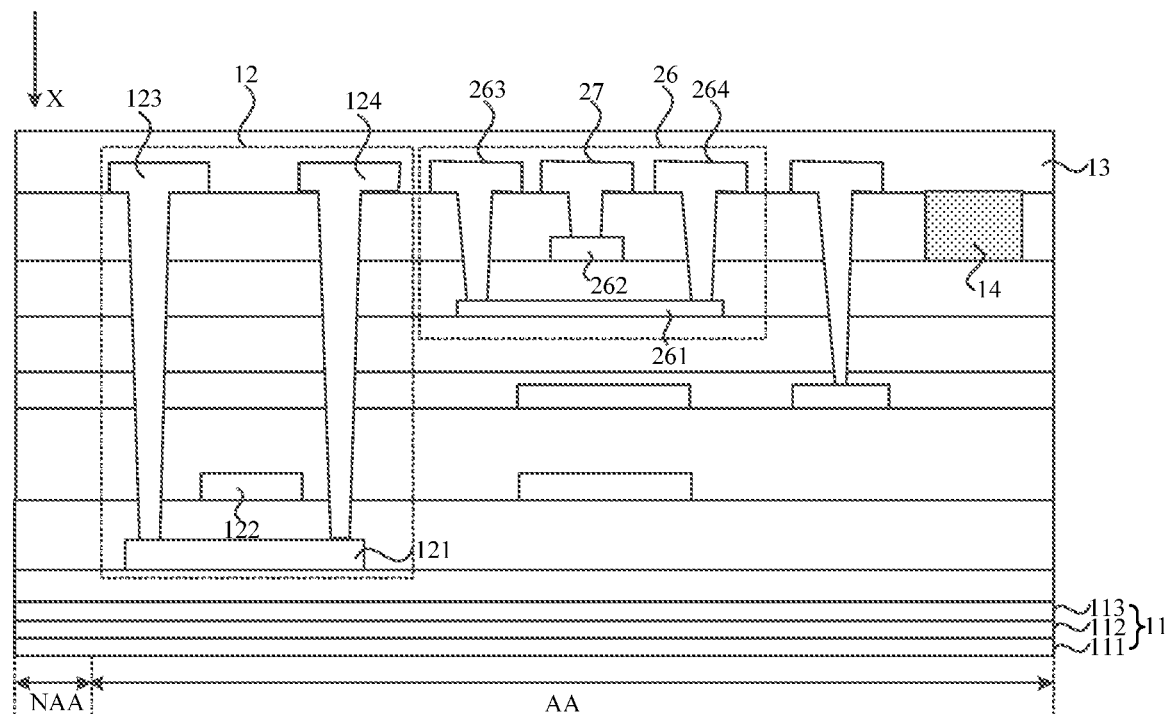
FIG. 22 is a structure view of another display panel according to an embodiment of the present disclosure.

FIG. 22 is a structure view of a display panel according to another embodiment of the present disclosure. As shown in FIG. 22, in the direction perpendicular to the base substrate 11, the first organic area 14 is located in an area outside the first transistor 12 and the second transistor 26, the first organic area 14 is not overlapped with the first transistor 12, and the first organic area 14 is not overlapped with the second transistor 26.

In the embodiment shown in FIG. 22, the direction perpendicular to the base substrate 11 is used as a projection direction, the first organic area 14 is located in an area outside the first transistor 12 and the second transistor 26, that is, the vertical projection of the first organic area 14 on the plane where the base substrate 11 is located is overlapped with neither the vertical projection of the first transistor 12 on the plane where the base substrate 11 is located nor the vertical projection of the second transistor 26 on the plane where the base substrate 11 is located so that the area where the first transistor 12 is located and the area where the second transistor 26 is located are both complete areas. In this manner, while the stable performance of the area where the first transistor 12 is located and the area where the second transistor 26 is located can be ensured, the first organic area 14 is added to improve the bendability of the display panel.

With continued reference to the embodiments shown in FIGS. 17 to 21, the direction perpendicular to the base substrate 11 is used as a projection direction, the first organic area 14 is overlapped with at least part of the first transistor 12, and the first organic area 14 is not overlapped with the second transistor 26.

As shown in FIGS. 17 to 21, the direction perpendicular to the base substrate 11 is used as a projection direction, the first organic area 14 is overlapped with at least part of the first transistor 12, and the first organic area 14 is not overlapped with the second transistor 26. That is, the vertical projection of the first organic area 14 on the plane where the base substrate 11 is located is at least partially overlapped with the vertical projection of the first transistor 12 on the plane where the base substrate 11, and the vertical projection of the first organic area 14 on the plane where the base substrate 11 is located is not overlapped with the vertical projection of the second transistor 26 on the plane where the base substrate 11 is located. The oxide semiconductor active layer in the second transistor 26 is more sensitive to hydrogen ions, water vapor, and oxygen than the silicon active layer in the first transistor 12. Therefore, the vertical projection of the first organic area 14 on the plane where the base substrate 11 is located is at least partially overlapped with the vertical projection of the first transistor 12 on the plane where the base substrate 11 is located so that the good bendability of the area where the first transistor 12 is disposed can be ensured; the vertical projection of the first organic area 14 on the plane where the base substrate 11 is located is not overlapped with the vertical projection of the second transistor 26 on the plane where the base substrate 11 is located so that the second active layer 261 in the second transistor 26 can be protected from corrosion caused by hydrogen ions, water vapor, and oxygen. In this manner, the stable performance of the second active layer 261 can be ensured, and thus the stable functions of the second transistor 26 and the entire display panel can be ensured.

It is noted that the first organic area 14 is overlapped with at least part of the first transistor 12, which may be the cases described as follows: the first organic area 14 is overlapped with part of the first transistor 12, or the first organic area 14 is overlapped with the entire the first transistor 12. In FIGS. 17 to 21, only the case where the first organic area 14 is located within the area between the first source 123 the first drain 124, and the first organic area 14 is overlapped with part of the first transistor 12 is used as an example for description rather than limitation, which is not limited by an embodiment of the present disclosure.

Figure 23:
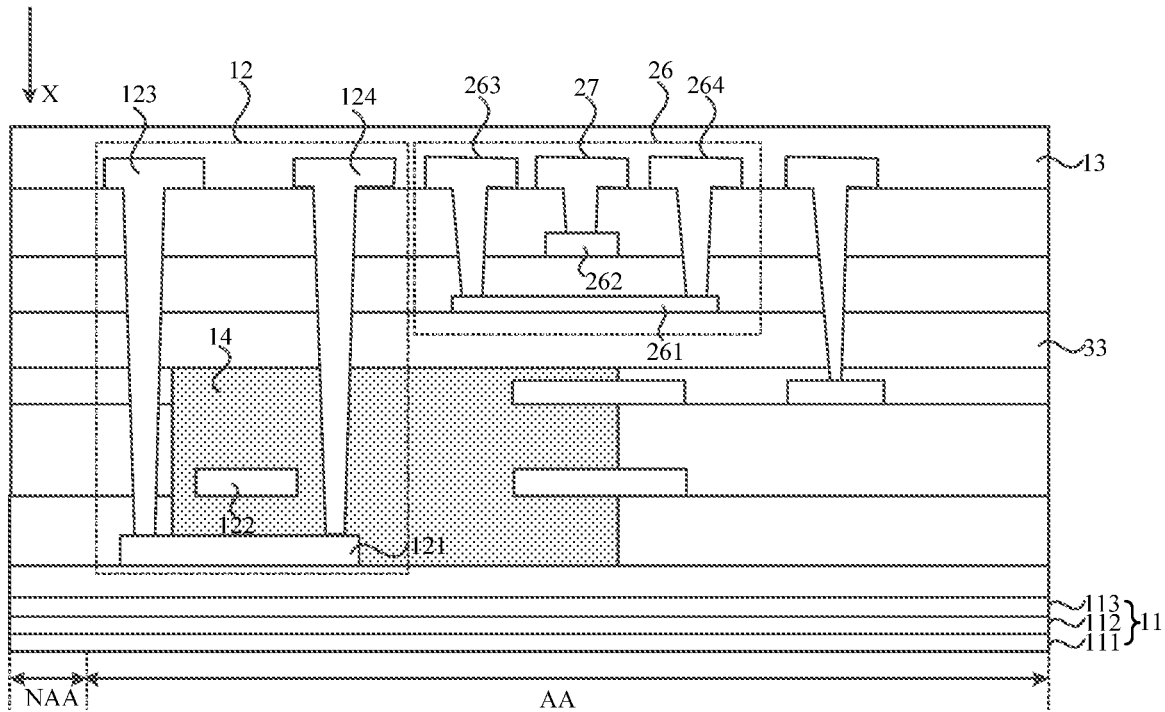
FIG. 23 is a structure view of another display panel according to an embodiment of the present disclosure.
Figure 24:
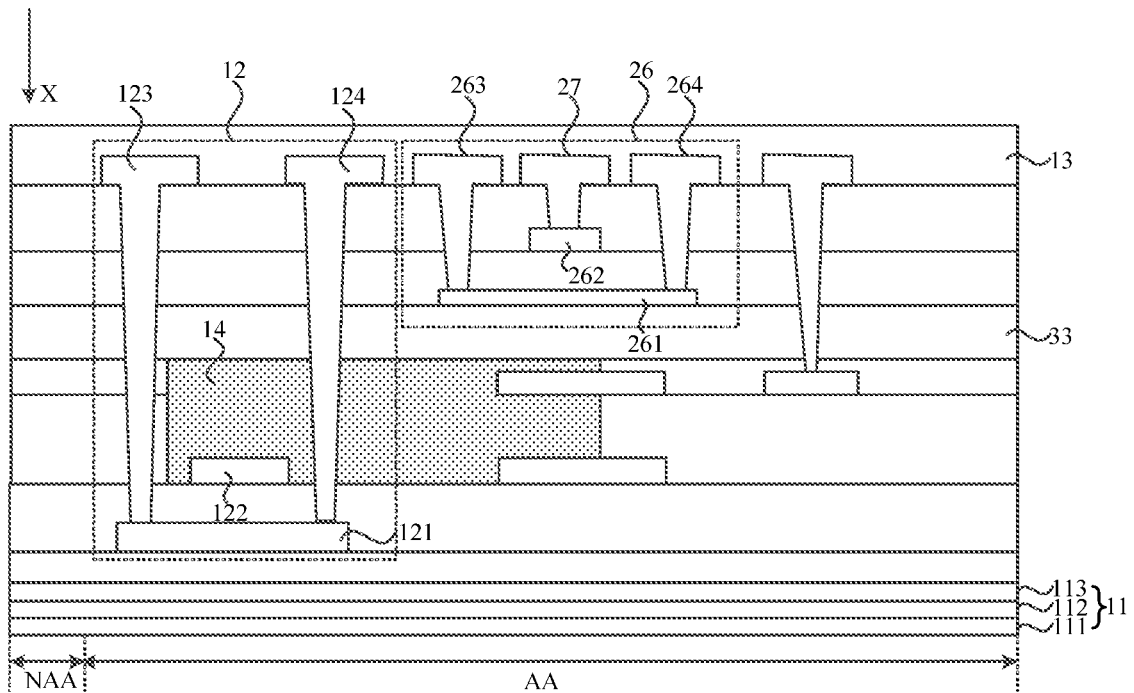
FIG. 24 is a structure view of another display panel according to an embodiment of the present disclosure.

FIG. 23 is a structure view of a display panel according to another embodiment of the present disclosure, and FIG. 24 is a structure view of a display panel according to yet another embodiment of the present disclosure. As shown in FIG. 23 and FIG. 24, the first organic area 14 is located between the film layer where the first active layer 121 is located and the film layer where the second active layer 261 is located, the direction perpendicular to the base substrate 11 is used as a projection direction, the first organic area 14 is at least partially overlapped with the first transistor 12, and the first organic area 14 is at least partially overlapped with the second transistor 26.

In the embodiments shown in FIG. 23 and FIG. 24, the first organic area 14 is located between the film layer where the first active layer 121 is located and the film layer where the second active layer 261 is located. In the actual preparation process, the second active layer 261 may be prepared after the first organic area 14 is obtained. Since the second active layer 261 is highly sensitive to hydrogen ions, water vapor, and oxygen, the hydrogen ions, water vapor, and oxygen may affect the performance of the second active layer 261. Therefore, the second active layer 261 is located on one side of the first organic area 14 facing away from the base substrate 11. The second active layer 261 is prepared after the first organic area 14 is prepared so that it can be ensured that the second active layer 261 is not affected by the first organic area 14, and thus the performance stability of the second active layer 261 and the second transistor 26 can be improved. Further, the first organic area 14 is located between the film layer where the first active layer 121 is located and the film layer where the second active layer 261 is located so that it can be ensured that the first organic area 14 is not in contact with the planarization layer 13. Therefore, the water and oxygen transmission channel between the first organic area 14 and the planarization layer 13 can be blocked, thereby avoiding the problem of water and oxygen corrosion caused by the first organic area 14. In another embodiment, the direction perpendicular to the base substrate 11 is used as a projection direction, the first organic area 14 is at least partially overlapped with the first transistor 12, and the first organic area 14 is at least overlapped with the second transistor 26.

That is, the vertical projection of the first organic area 14 on the base substrate 11 is at least partially overlapped with the vertical projections of the first transistor 12 and the second transistor 26 on the base substrate 11. In this manner, it can be ensured that the bendability of the area where the first transistor 12 is located and the area where the second transistor 26 is located can be improved, and thus the overall bendability of the display panel can be improved.

In the embodiments described with reference to FIG. 23 and FIG. 24, at least one inorganic layer is provided between the first organic area 14 and the second active layer 261.

In the embodiments shown in FIG. 23 and FIG. 24, the second active layer 261 includes an oxide semiconductor, the oxide semiconductor material is relatively sensitive to ions, water vapor, and oxygen, and hydrogen ions, water vapor, and oxygen may affect the characteristics of the second active layer 261. Therefore, at least one inorganic layer 33 is provided between the first organic area 14 and the second active layer 261. The hydrogen ions, water vapor, and oxygen entering through the first organic area 14 can be blocked through at least one inorganic layer 33. In this manner, it can be ensured that the second active layer 261 is protected from corrosion caused by hydrogen ions, water vapor, and oxygen, and the stable performance of the second active layer 261 can be ensured, thereby ensuring the stable functions of the second transistor 26 and the entire display panel.

In an embodiment, at least one inorganic layer between the first organic area 14 and the second active layer 261 may include a silicon oxide layer. The silicon oxide layer has an excellent hydrogen ion blocking effect. At least one silicon oxide layer is provided between the first organic area 14 and the second active source layer 261 so that the hydrogen ions entering through the first organic area 14 can be sufficiently blocked. In this manner, it can be ensured that the second active layer 261 is protected from corrosion caused by hydrogen ions, and the stable performance of the second active layer 261 can be ensured, and thus the stable functions of the second transistor 26 and the entire display panel can be further ensured.

As described with reference to the embodiment shown in FIG. 23, the first organic area 14 is in contact with the film layer where the first active layer 121 is located; or as shown in FIG. 24, at least one inorganic layer is provided between the first organic area 14 and the first active layer 121.

In the embodiment shown in FIG. 23, the first organic area 14 is in contact with the film layer where the first active layer 121 is located. In this manner, the first active layer 121 can be directly used as an organic layer so that the bendability of the first transistor 12 and the entire display panel can be further improved. As shown in FIG. 24, at least one inorganic layer is disposed between the first organic area 14 and the first active layer 121, and the first active layer 121 is isolated from water and oxygen through at least one inorganic layer. In this manner, it can be ensured that the first active layer 121 is protected from water and oxygen corrosion, the performance stability of the first active layer 121 can be improved, and thus the performance stability of the first transistor 12 and the entire display panel can be improved.

Figure 25:
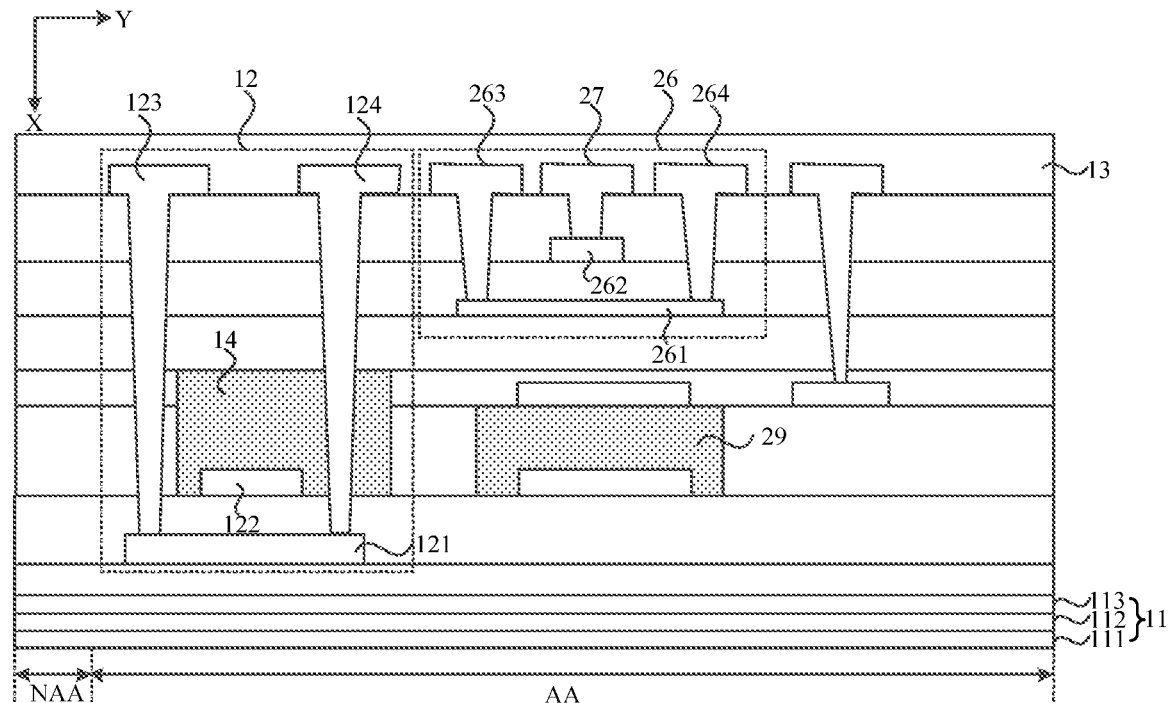
FIG. 25 is a structure view of another display panel according to an embodiment of the present disclosure.

FIG. 25 is a structure view of a display panel according to another embodiment of the present disclosure. As shown in FIG. 25, at least one insulating layer and a third organic area 29 are provided between the film layer where the first active layer 121 is located and the film layer where the second active layer 261 is located. The insulating layer in the third organic area 29 is made of organic material. The direction perpendicular to the base substrate 11 is used as a projection direction, the third organic area 29 is at least partially overlapped with the second transistor 26, and in the direction perpendicular to the base substrate 11 (the X direction as shown in the figure), at least one inorganic layer is provided between the third organic area 29 and the second active layer 261.

In the embodiment shown in FIG. 25, a third organic area 29 is further disposed between the film layer where the first active layer 121 is located and the film layer where the second active layer 261 is located, the vertical projection of the third organic area 29 on the plane where the base substrate 11 is located is at least partially overlapped with the vertical projection of the second transistor 26 on the plane where the base substrate 11 is located, and the third organic area 29 is filled with organic material. In this manner, the bendability of the area where the second transistor 26 is located can be improved through the third organic area 29. In another embodiment, at least one inorganic layer is disposed between the third organic area 29 and the second active layer 261, and the second active layer 261 is isolated from hydrogen ions, water, and oxygen through at least one inorganic layer. In this manner, it can be ensured that the second active layer 261 is protected from corrosion caused by hydrogen ions, water vapor, and oxygen, the performance stability of the second active layer 261 can be improved, and thus the performance stability of the second transistor 26 and the entire display panel can be improved.

In another embodiment, the third organic area 29 is located between the film layer where the first active layer 121 is located and the film layer where the second active layer 261 is located so that it can be ensured that the third organic area 29 is not in contact with the planarization layer 13. Therefore, the water and oxygen transmission channel between the first organic area 14 and the planarization layer 13 can be blocked, thereby avoiding the problem of water and oxygen corrosion caused by the third organic area 29.

With continued reference to FIG. 25, the vertical projection of the first organic area 14 on the plane where the base substrate 11 is located is at least partially overlapped with the vertical projection of the first transistor 12 on the plane where the base substrate 11 is located, and the bendability of the area where the first transistor 12 is located can be improved through the first organic area 14.

In another embodiment, the first organic area 14 is not in contact with the third organic area 29 in the Y direction shown in the figure. The Y direction may be the direction in which the first transistor 12 points to the second transistor 26, that is, the first organic area 14 and the third organic area 29 are disposed independently. On the one hand, the following case can be avoided: a large area where the organic material is disposed is formed due to the continuous connection of the first organic area 14 and the third organic area 29, and thus the supporting effect of the display panel is reduced. On the other hand, the first organic area 14 corresponds to the first transistor 12, and the first organic area 14 only needs to satisfy the relevant film layer design of the first transistor 12; the third organic area 29 corresponds to the second transistor 26, and the third organic area 29 only needs to satisfy the relevant film layer design of the second transistor 26. In this manner, the highly-independent configuration and flexible arrangements of the first organic area 14 and the third organic area 29 can be ensured; and the following case can be avoided: when the first transistor 12 and the second transistor 26 are provided with a common organic area, the common organic area needs to satisfy the film layer designs of the first transistor 12 and the second transistor 26, and thus multiple restrictions on the arrangement of the common organic area exist and the arrangement of the common organic area is single.

Figure 26:
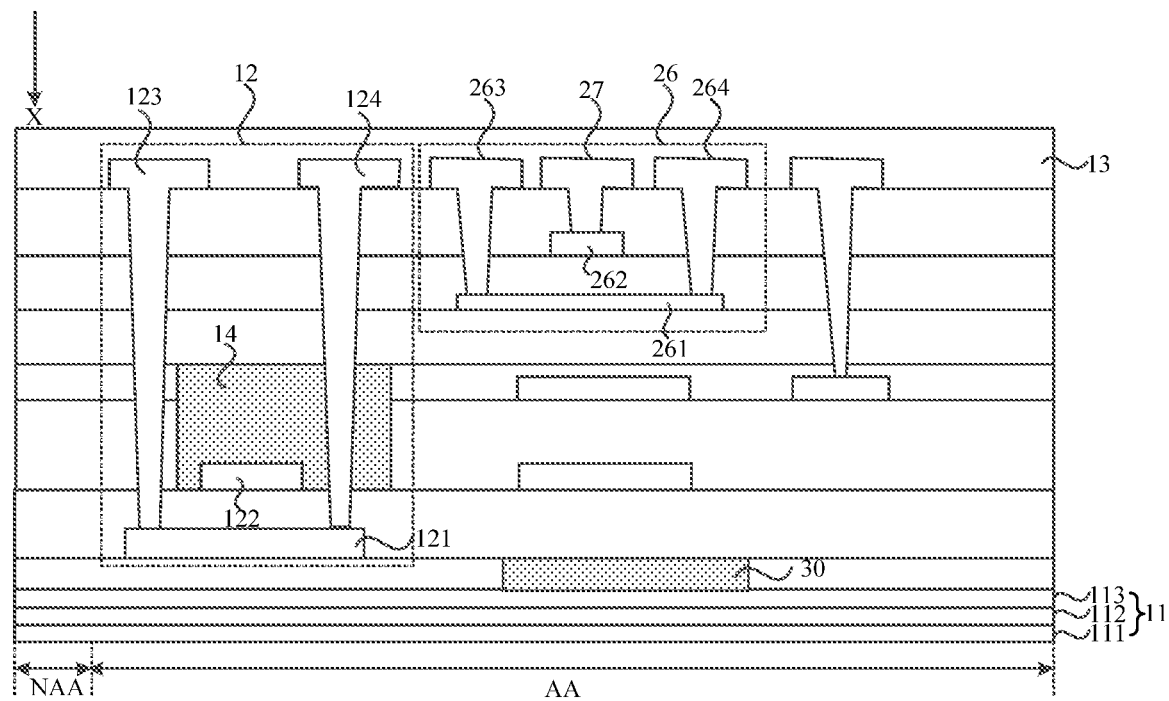
FIG. 26 is a structure view of another display panel according to an embodiment of the present disclosure.

FIG. 26 is a structure view of a display panel according to another embodiment of the present disclosure. As shown in FIG. 26, at least one insulating layer and a fourth organic area 30 are further provided between the base substrate 11 and the film layer where the first active layer 121 is located. The insulating layer in the fourth organic area 30 is made of organic material, and the base substrate 11 is made of polyimide. The direction perpendicular to the base substrate 11 is used as a projection direction, and the fourth organic area 30 is at least partially overlapped with the second transistor 26.

In the embodiment shown in FIG. 26, at least one insulating layer and a fourth organic area 30 are further provided between the base substrate 11 and the film layer where the first active layer 121 is located, the vertical projection of the fourth organic area 30 on the plane where the base substrate 11 is located is at least partially overlapped with the vertical projection of the second transistor 26 on the plane where the base substrate 11 is located, and the fourth organic area 30 is filled with organic material. In this manner, the bendability of the area where the second transistor 26 is located can be improved through the fourth organic area 30. In another embodiment, the base substrate 11 may be a flexible substrate and may include one layer of polyimide flexible substrate or two layers of polyimide flexible substrates. In FIG. 26, the case where the base substrate 11 includes a first flexible substrate 111, a second flexible substrate 113, and an insulating layer 112 located between the first flexible substrate 111 and the second flexible substrate 113 is used as an example for description, where the first flexible substrate 111 and the second flexible substrate 113 are polyimide flexible substrates Moreover, the organic material in the fourth organic area 30 is different from the flexible base substrate and the fourth organic area 30 has a different structure from the flexible base substrate.

Figure 27:
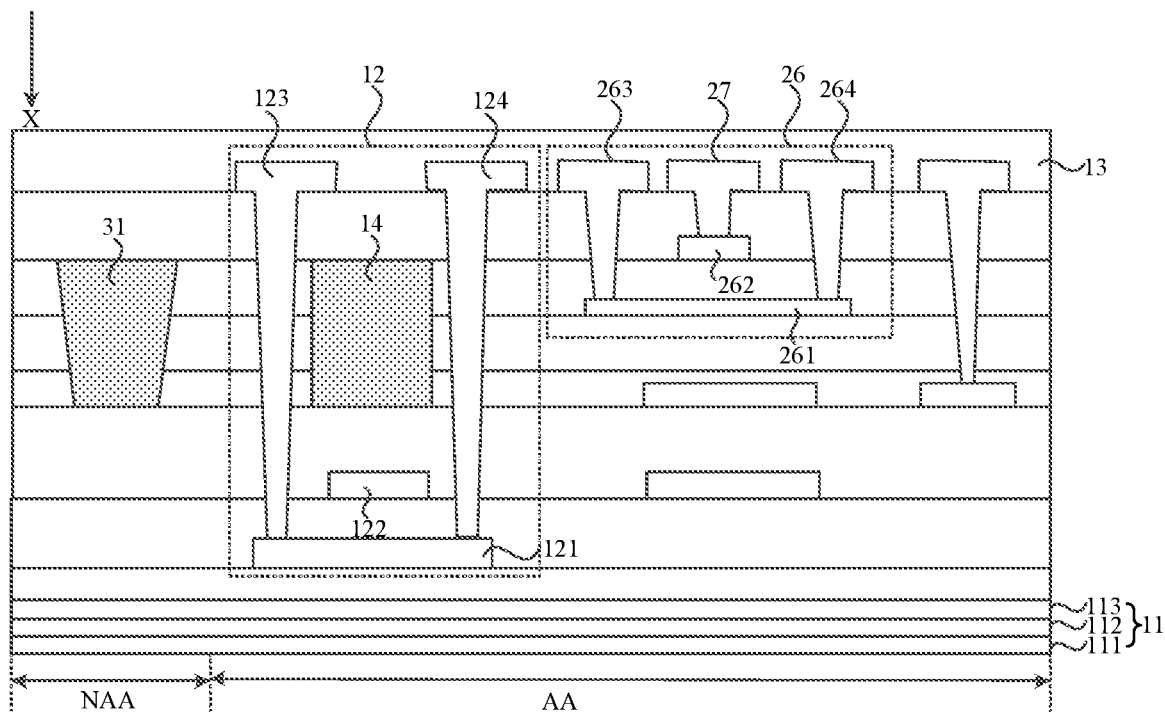
FIG. 27 is a structure view of another display panel according to an embodiment of the present disclosure.

FIG. 27 is a structure view of another display panel according to another embodiment of the present disclosure. As shown in FIG. 27, the non-display area NAA of the display panel 10 includes at least one inorganic layer, the at least one inorganic layer includes a first groove 31, and the first groove 31 is filled with organic material. In the direction perpendicular to the base substrate 11 (the X direction as shown in the figure), the first groove 31 penetrates the same film layers as the first organic area 14.

In the embodiment shown in FIG. 27, the non-display area NAA of the display panel 10 is provided with a first groove 31. The first groove 31 may penetrate at least one inorganic layer, and the first groove 31 is at least partially filled with organic material. Since the Young's modulus of the organic material is relatively small and the bendability of the organic material is good, the first groove 31 is formed in the inorganic layer, and the first groove 31 is at least partially filled with organic material. In this manner, on the one hand, the bendability of the non-display area NAA can be improved; on the other hand, if a crack occurs in the inorganic material, the organic material in the first groove 31 can block the crack in the inorganic material, and thus prevent or slow the crack from spreading to the display area AA.

In the embodiment described with reference to FIG. 27, in the direction perpendicular to the base substrate 11 (the X direction as shown in the figure), the first groove 31 penetrates the same film layers as the first organic area 14. In this manner, the first organic area 14 and the first groove 31 are implemented in the same mask process so that it can be ensured that the first organic area and the via have a simple preparation process and the preparation process is saved.

In another embodiment, the non-display area NAA may include a bending area (not shown in the figure), and the first groove 31 may be disposed in the bending area, thereby further improving the bendability of the bending area.

Figure 28:
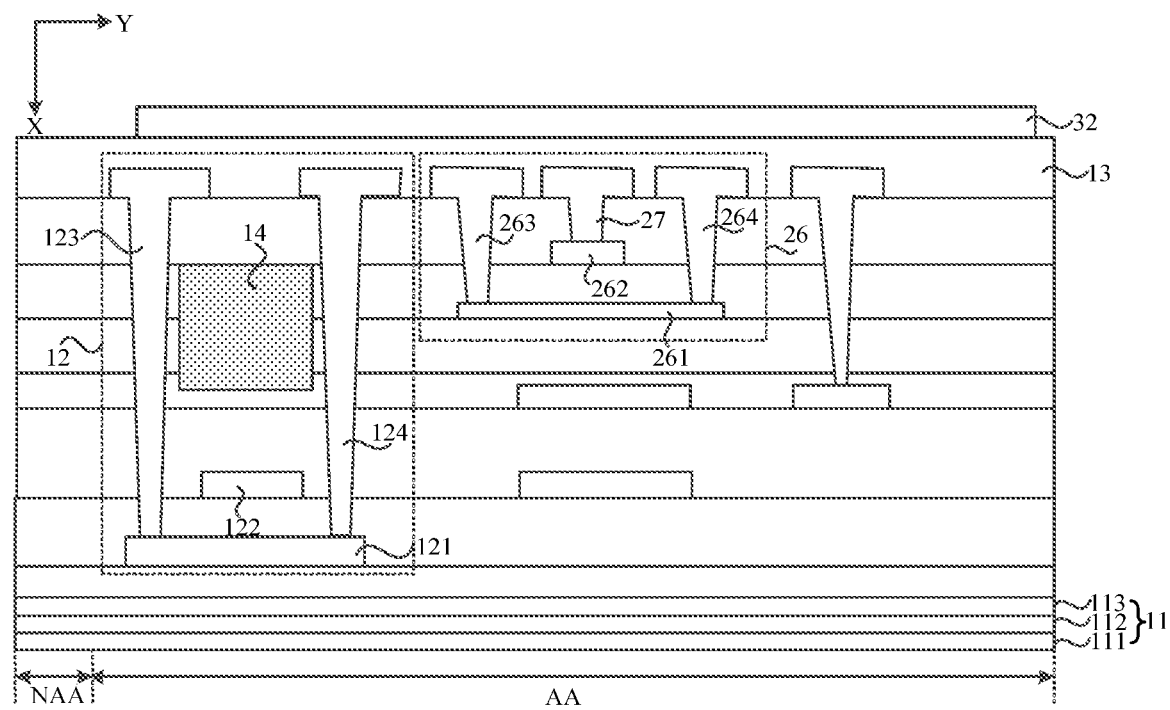
FIG. 28 is a structure view of another display panel according to an embodiment of the present disclosure.

FIG. 28 is a structure view of a display panel according to another embodiment of the present disclosure. As shown in FIG. 28, the display panel 10 includes a first metal layer 32, and the first metal layer 32 is located on one side of the planarization area 13 facing away from the base substrate 11. The direction perpendicular to the base substrate 11 is used as a projection direction, and the first metal layer 32 is at least partially overlapped with the first organic area 14.

In the embodiment shown in FIG. 28, the display panel 10 may further include a first metal layer 32. The first metal layer 32 is located on one side of the planarization layer 13 facing away from the base substrate 11. The first metal layer 32 may be, for example, a transition metal between the positive electrode of a light-emitting element and the output terminal (source or drain) of a transistor. The positive electrode of the light-emitting element is electrically connected to the first metal layer 32, and the first metal layer 32 is electrically connected to the output terminal of the transistor, so that the poor connection between the positive electrode and the output terminal of the transistor due to deep drilling can be avoided. The first metal layer 32 may, for example, transmit a first voltage signal and be connected in parallel with the first voltage signal wiring in other film layers so that the transmission impedance of the first voltage signal can be reduced. The first metal layer 32 may also be other types of wiring. For example, in the case where the pixel circuit includes both a P-type transistor and an N-type transistor, the first metal layer 32 may serve as the scan line wiring layer of one of the preceding types of transistors, which will not be exemplarily described by an embodiment of the present disclosure one by one. Since the first metal layer 32 is located on one side of the planarization layer 13 facing away from the base substrate 11, and the first metal layer 32 is generally a large-area covering wiring. In this manner, the first metal layer 32 may serve as a water-and-oxygen blocking layer of the planarization layer 13 to block the external water and oxygen from entering the planarization layer. In another embodiment, the vertical projection of the first metal layer 32 on the plane where the base substrate 11 is located is at least partially overlapped with the vertical projection of the first organic area 14 on the plane where the base substrate 11 is located. The first metal layer 32 may block water and oxygen from entering the planarization layer 13. Therefore, the water and oxygen can be blocked from entering the first organic area 14 where the vertical projection of the first organic area 14 is overlapped with the vertical projection of the first metal layer 32, more water and oxygen can be prevented from entering the first organic area 14, and thus the overall water-and-oxygen blocking capacity of the display panel can be improved.

The above embodiments describe, in part, the relative relationship between the transistors and the organic areas in the display panel from the perspective of the three-dimensional structure of the display panel. The following is, in part, a description of the arrangement of the organic areas in the display panel from the specific layout structure of the display panel.

Figure 29:
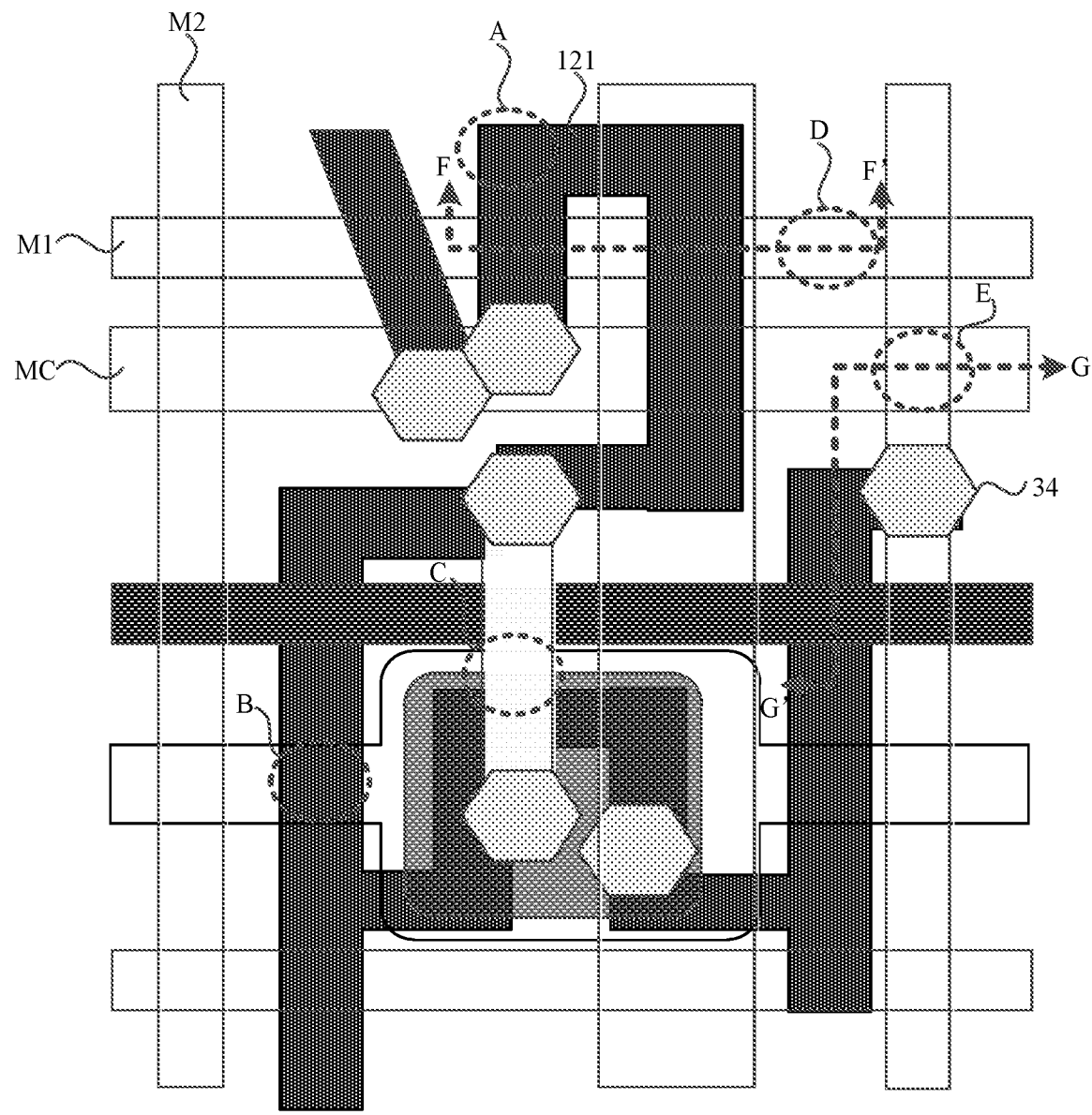
FIG. 29 is a layout view of a display panel according to an embodiment of the present disclosure.

FIG. 29 is a layout view of a display panel according to an embodiment of the present disclosure. FIG. 29 exemplarily illustrates the structure view of a pixel circuit in the display panel. FIG. 29 also exemplarily illustrates three metal layers, namely the M1 layer, the MC layer, and the M2 layer. The M1 layer may be the film layer where the first gate is located, the MC layer may be the film layer where one of the electrode plates of a capacitor structure is located, and the M2 layer may be the film layer where the first source and the first drain are located. In an embodiment of the present disclosure, only the case where three metal layers are provided between the planarization layer and the film layer where the first active layer 121 is located is used as an example. It is to be understood that other metal layers may further be provided between the planarization layer and the film layer where the first active layer 121 is located. For example, the other metal layers may be the film layer where the bottom gate of the second transistor is located, or other metal layers may further be provided, and no more examples will be given here.

It is noted that the hexagonal structure 34 in FIG. 29 is a via connecting different film layers, for example, the via connecting the M2 layer with the first active layer 121.

In the embodiment shown in FIG. 29, at least one metal layer is provided between the planarization layer (not shown in the figure) and the film layer where the first active layer 121 is located, the direction perpendicular to the base substrate is used as a projection direction, and the first organic area (not shown in the figure) is not overlapped with any one of the at least one metal layer.

As shown in area A in FIG. 29, the direction perpendicular to the base substrate is used as a projection direction, and the first organic area (not shown in the figure) is not overlapped with any one of the at least one metal layer. In this manner, the any one of the at least one metal layer can be prevented from corrosion caused by water and oxygen that may be carried in the first organic area, the stable performance of the metal layer can be ensured, the signal transmitted in the metal layer can be transmitted normally without short circuit or open circuit, and thus the normal work of the display panel can be ensured. In an embodiment, for the case where the first organic area is not overlapped with any one of the at least one metal layer, refer to FIG. 8.

With continued reference to FIG. 29, at least one metal layer is provided between the planarization layer and the film layer where the first active layer 121 is located, the direction perpendicular to the base substrate is used as a projection direction, and the first organic area is not overlapped with one of the at least one metal layer.

As shown in area B in FIG. 29, the direction perpendicular to the base substrate is used as a projection direction, and the first organic area is overlapped with one of the at least one metal layer. In FIG. 29, the case where the first organic area is overlapped with the MC metal layer is used as an example. In this manner, the bendability of the area where this metal layer is located can be improved, and thus the bendability of the entire display panel can be improved. In an embodiment, for the case where the first organic area is overlapped with one of the at least one metal layer, refer to FIG. 1.

In an embodiment, in the case where the first organic area is overlapped with one of the at least one metal layer, an inorganic layer may be disposed between the first organic area and the metal layer. In this manner, the inorganic layer can block the water and oxygen in the first organic area from entering the metal layer, the stable performance of the metal layer can be ensured, the signal transmitted in the metal layer can be transmitted normally, and thus the normal work of the display panel can be ensured.

With continued reference to FIG. 29, at least two metal layers are provided between the planarization layer and the film layer where the first active layer 121 is located. The first organic area is located between the two metal layers, or the first organic area is located on one side of one of the at least two metal layers, the one of the at least two mental layer faces away from the base substrate, and the one side of the one of the least two metal layers faces away from the base substrate, or the first organic area is located on one side of one of the at least two metal layers, the one of the at least two mental layer faces toward the base substrate, and the one side of the one of the least two metal layers faces toward the base substrate.

As shown in area C in FIG. 29, at least two metal layers are provided between the planarization layer and the film layer where the first active layer 121 is located. Area C in the figure includes three metal layers, namely the M1 metal layer, the MC metal layer, and the M2 metal layer. The direction perpendicular to the base substrate is used as a projection direction, and the first organic area is located between two metal layers. For example, the first organic area may be located between the M1 metal layer and the MC metal layer, or the first organic area may be located between the MC metal layer and the M2 metal layer, which is not limited by an embodiment of the present disclosure. Alternatively, among the three metal layers, namely the M1 metal layer, the MC metal layer, and the M2 metal layer, the M2 metal layer is one of the three metal layers facing away from the base substrate. Therefore, the first organic area may be located on one side of the M2 metal layer facing away from the base substrate. Alternatively, among the three metal layers, namely the M1 metal layer, the MC metal layer, and the M2 metal layer, the M1 metal layer is one of the three metal layers adjacent to the base substrate. Therefore, the first organic area may be located on one side of the M1 metal layer adjacent to the base substrate. To sum up, in the case where at least two metal layers are provided between the planarization layer and the film layer where the first active layer 121 is located, the first organic area may include multiple different arrangements, which is not limited in an embodiment of the present disclosure. No matter which arrangement is adopted, the bendability of the area where the metal layers are located can be improved, and thus the bendability of the entire display panel can be improved. In another embodiment, the first organic area may be located on one side of one of the at least two metal layers, the one of the at least two mental layer faces away from the base substrate, and the one side of the one of the least two metal layers faces away from the base substrate, or the first organic area may be located on one side of one of the at least two metal layers, the one of the at least two mental layer faces toward the base substrate, and the one side of the one of the least two metal layers faces toward the base substrate. That is, the first organic area is not disposed between the two metal layers, so as to avoid relatively large crosstalk between two adjacent metal layers. In another embodiment, for the case where the first organic area is overlapped with at least two metal layers, refer to FIGS. 4, 5, 6, 9, and 10. In the preceding figures, the case where the first organic area is located between two metal layers is used as an example.

In another embodiment, in the case where the first organic area is overlapped with at least two metal layers, an inorganic layer may be disposed between the first organic area and the metal layers. In this manner, the inorganic layer can block the water and oxygen in the first organic area from entering the metal layers, the stable performance of the metal layers can be ensured, the signals transmitted in the metal layers can be transmitted normally, and thus the normal work of the display panel can be ensured.

Figure 30:
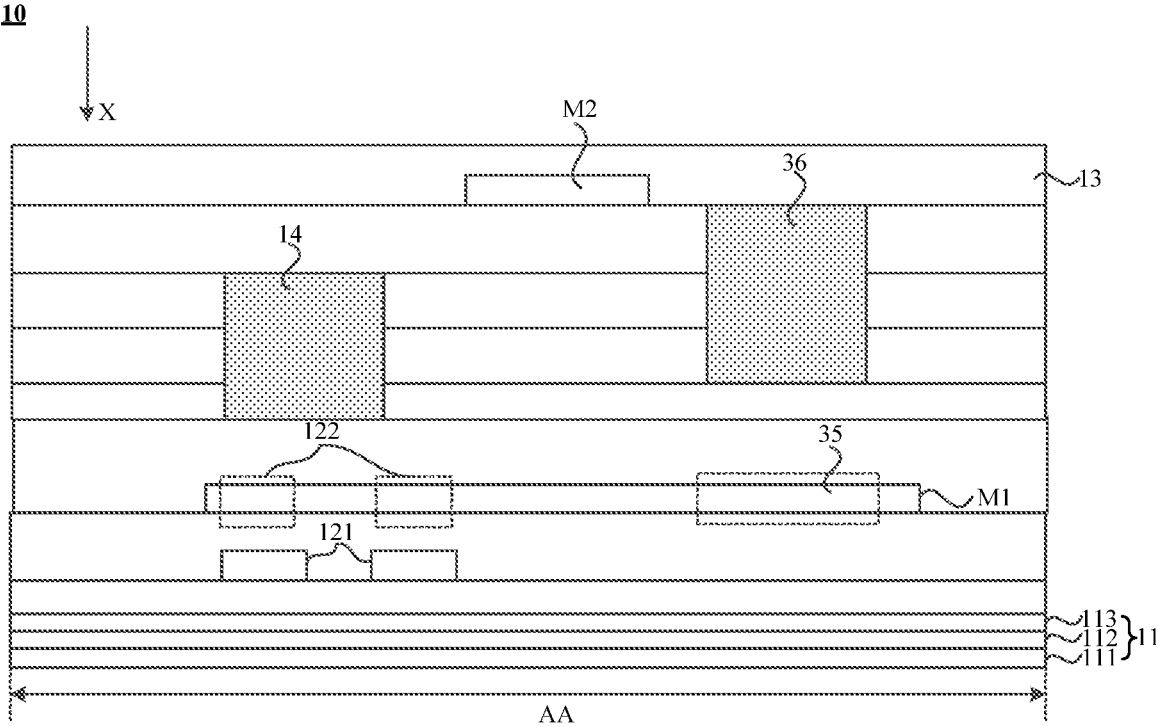
FIG. 30 is a sectional view of the display panel of FIG. 29 taken along F-F'.

FIG. 30 is a sectional view of the display panel of FIG. 29 taken along the F-F section. In conjunction with FIG. 29 and FIG. 30, a second metal layer is provided between the planarization layer 13 and the film layer where the first active layer 121 is located. The second metal layer includes a first metal area 35. In the direction perpendicular to the base substrate (the X direction as shown in the figure), the first metal area is not overlapped with the first active layer 121. The display panel further includes a fifth organic area 36. In the direction perpendicular to the base substrate, the fifth organic area 36 is at least partially overlapped with the first metal area 35. The fifth organic area 36 is located on one side of the second metal layer facing away from the base substrate 11, and/or the fifth organic area 36 is located on one side of the second metal layer facing toward the base substrate.

As shown in area D in FIG. 29 and FIG. 30, the case where the second metal layer is the M1 metal layer is used as an example for description. As shown in area D in the figure, the second metal layer includes the first metal area 35 that is not overlapped with the first active layer 121. That is, the first metal area 35 is area D in the figure. In this case, the direction perpendicular to the base substrate is used as a projection direction, the fifth organic area 36 may be at least partially overlapped with the first metal area 35, and the fifth organic area 36 may be located on one side of the second metal layer facing away from the base substrate 11, and/or the fifth organic area 36 is located on one side of the second metal layer facing toward the base substrate 11. In this manner, the bendability of the area where the first metal area 35 is located can be improved, and thus the bendability of the entire display panel can be improved.

It is noted that in FIG. 30, only the case where the fifth organic area 36 is located on one side of the second metal layer (the M1 layer) facing away from the base substrate 11 is used as an example for description. Moreover, in FIG. 29 and FIG. 30, the first transistor may be a double-gate transistor. For example, in the direction perpendicular to the base substrate 11, two overlapping areas exist between the first active layer 121 and the M1 metal layer. The overlapping areas between the first active layer 121 and the M1 metal layer are the gates 122 of the first transistor. The first transistor 12 with a double-gate design can reduce leakage. Additionally, it is to be noted that the source and drain of the first transistor are not shown in the figure.

In another embodiment, the fifth organic area 36 is at least partially overlapped with, or is not overlapped with the first organic area 14 in the direction perpendicular to the base substrate; or the fifth organic area 36 may be not in contact with the first organic area 14 in the direction parallel to the plane where the base substrate 11 is located. An embodiment of the present disclosure does not limit the relative positional relationship between the fifth organic area 36 and the first organic area 14. In FIG. 30, only the case where the fifth organic area 36 is not overlapped with the first organic area 14 in the direction perpendicular to the base substrate, and the fifth organic area 36 is not in contact with the first organic area 14 in the direction parallel to the plane where the base substrate 11 is located is used as an example for description.

With continued reference to FIG. 30, in the case where the fifth organic area 36 is overlapped with the first metal area 35, an inorganic layer may be disposed between the second metal layer (the M1 layer) where the first metal area 35 is located and the fifth organic area 36. In this manner, the inorganic layer can block the water vapor and oxygen in the fifth organic area 36 from entering the second metal layer (the M1 layer) where the first metal area 35 is located, the stable performance of the second metal layer (the M1 layer) where the first metal area 35 is located can be ensured, the signal transmitted in the metal layer can be transmitted normally, and thus the normal work of the display panel can be ensured.

Figure 31:
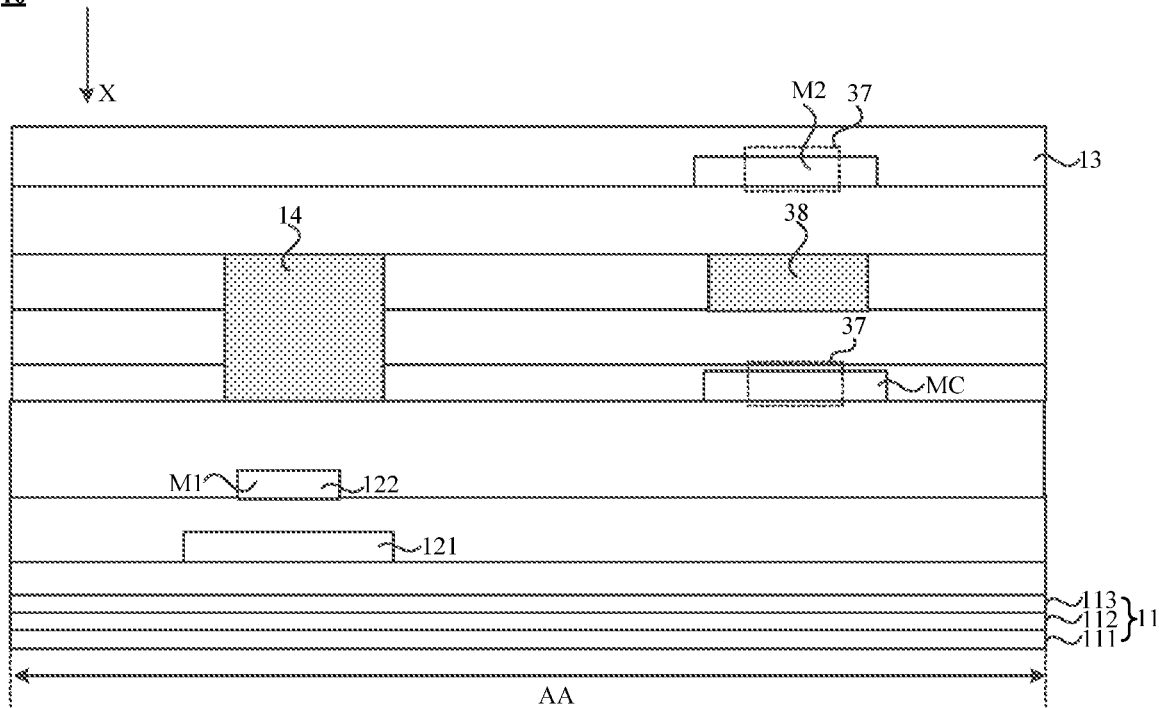
FIG. 31 is a sectional view of the display panel of FIG. 29 taken along G-G'.

FIG. 31 is a sectional view of the display panel of FIG. 29 taken along the G-G' section. In conjunction with FIG. 29 and FIG. 31, a third metal layer and a fourth metal layer are provided between the planarization layer 13 and the film layer where the first active layer 121 is located. The fourth metal layer is located on one side of the third metal layer facing away from the base substrate 11. The third metal layer and the fourth metal layer both include a second metal area 37. In the direction perpendicular to the base substrate (the X direction as shown in the figure), the second metal area 37 is not overlapped with the first active layer 121. The display panel further includes a sixth organic area 38. In the direction perpendicular to the base substrate, the sixth organic area 38 is at least partially overlapped with the second metal area 37. The sixth organic area 38 is located on one side of the fourth metal layer facing away from the base substrate 11, or the sixth organic area 38 is located on one side of the third metal layer facing toward the base substrate, or the sixth organic area 38 is located between the third metal layer and the fourth metal layer.

As shown in area E in FIG. 29 and FIG. 31, the case where the third metal layer is the MC metal layer and the fourth metal layer is the M2 metal layer is used as an example for description. The third metal layer and the fourth metal layer both include a second metal area 37 that is not overlapped with the first active layer 121. That is, the second metal area 37 is area E in the figure. In this case, the direction perpendicular to the base substrate is used as a projection direction, the six organic area 38 may be at least partially overlapped with the second metal area 37, and the sixth organic area may be located on one side of the fourth metal layer facing away from the base substrate, or the sixth organic area may be located on one side of the third metal layer facing the base substrate, or the sixth organic area is located between the third metal layer and the fourth metal layer. In this manner, the bendability of the area where the second metal area is located can be improved, and thus the bendability of the entire display panel can be improved.

It is noted that in FIG. 31, only the case where the sixth organic area 38 is located between the third metal layer (the MC layer) and the fourth metal layer (the M2 layer) is used as an example for description.

In another embodiment, the sixth organic area 38 is at least partially overlapped with or is not overlapped with the first organic area 14 in the direction perpendicular to the base substrate 11; or the sixth organic area 38 may be not in contact with the first organic area 14 in the direction parallel to the plane where the base substrate 11 is located. An embodiment of the present disclosure does not limit the relative positional relationship between the sixth organic area 38 and the first organic area 14. In FIG. 31, only the case where the sixth organic area 38 is not overlapped with the first organic area 14 in the direction perpendicular to the base substrate, and the sixth organic area 38 is not in contact with the first organic area 14 in the direction parallel to the plane where the base substrate 11 is located is used as an example for description.

With continued reference to FIG. 31, in the case where the sixth organic area 38 is overlapped with the second metal area 37, an inorganic layer may be disposed between the third metal layer (the MC layer) and the fourth metal layer (the M2 layer) where the respective second metal area is located and the sixth organic area 38. In this manner, the inorganic layer can block the water vapor and oxygen in the sixth organic area 38 from entering the third metal layer and/or the fourth metal layer where the respective second metal area 37 is located, the stable performance of the metal layers where the respective second metal area is located can be ensured, the signals transmitted in the metal layers can be transmitted normally, and thus the normal work of the display panel can be ensured.

Figure 32:
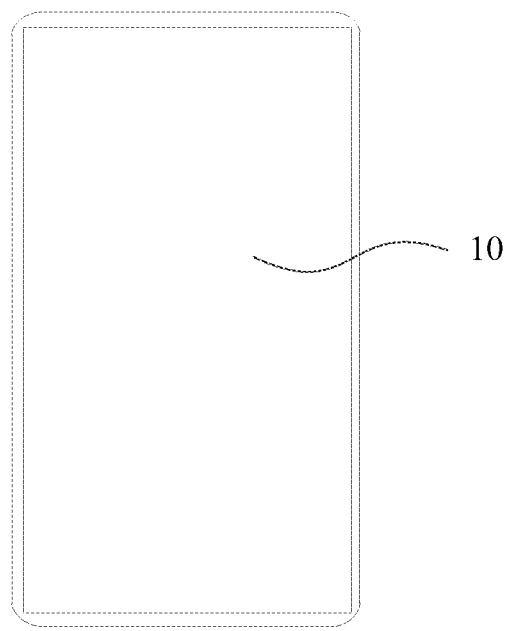
FIG. 32 is a structure view of a display device according to an embodiment of the present disclosure.

Based on the same concept, an embodiment of the present disclosure further provides a display device. This display device includes any display panel provided in the preceding embodiments. Referring to FIG. 32, in accordance with one embodiment, display device 100 includes a display panel 10. Therefore, this display method also has the beneficial effects of the display panel provided in the preceding embodiments and the same details may be referred to the preceding description of the display panel and are not repeated herein.

The display device 100 provided in embodiments of the present disclosure may be the phone shown in FIG. 32, or may be any electronic product with the display function, including but not limited to the following categories: television, laptop, desktop display, tablet computer, digital camera, smart bracelet, smart glasses, vehicle-mounted display, industrial control equipment, medical display screen, touch interactive terminal, and the like, and no special limitations are made thereto in embodiments of the present disclosure.

It is noted that the preceding are only preferred embodiments of the present disclosure and the technical principles used therein. It is to be understood by those skilled in the art that the present disclosure is not limited to the particular embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
   a base substrate;
   a first transistor, wherein the first transistor comprises a first active layer, a first gate, a first source, and a first drain, wherein the first source and the first drain are located on one side of the first active layer facing away from the base substrate, and the first gate is located between the first active layer, and both the first source and the first drain; and
   a planarization layer, wherein the planarization layer is located on a same side of the first source and the first drain facing away from the base substrate,
   wherein,
   in a direction perpendicular to the base substrate, at least one insulating layer and a first organic area are provided between a film layer where the first active layer is located and the planarization layer, and an insulating layer in the first organic area is made of organic material; and
   the display panel comprises a display area and a non-display area, and the first organic area is located in the display area;
   wherein
   at least one first inorganic area is further provided between the film layer where the first active layer is located and the planarization layer, and an insulating layer in the at least one first inorganic area is made of inorganic material;
   wherein
   the display panel further comprises a first capacitor, wherein the first capacitor comprises a first electrode plate and a second electrode plate; and
   wherein
   in the direction perpendicular to the base substrate, the first electrode plate and the second electrode plate are located between the planarization layer and the film layer where the first active layer is located, and the first electrode plate is located on one side of the second electrode plate facing away from the base substrate, wherein the first organic area is located between the first electrode plate and the planarization layer, and at least one inorganic layer is provided between the first organic area and the first electrode plate.

2. The display panel of claim 1, wherein
   in the direction perpendicular to the base substrate, the at least one first inorganic area is located between the first organic area and the planarization layer, and at least inorganic layer is provided between the first organic area and the planarization layer.

3. The display panel of claim 1, wherein
   with the direction perpendicular to the base substrate as a projection direction, the first organic area is located in an area outside the first transistor, and the first organic area is not overlapped with the first transistor.

4. The display panel of claim 1, wherein
   in the direction perpendicular to the base substrate, the first organic area extends to the base substrate, the base substrate is made of polyimide, and at least one organic layer is provided between the film layer where the first active layer is located and the base substrate.

5. The display panel of claim 1, wherein
   in the direction perpendicular to the base substrate, a second organic area is further provided between the base substrate and the planarization layer, and an insulating layer in the second organic area is made of organic material; and
   in the direction perpendicular to the base substrate, at least one inorganic layer is provided between the first organic area and the second organic area.

6. The display panel of claim 1, wherein
   the non-display area comprises at least one inorganic layer, the at least one inorganic layer comprises a first groove, and the first groove is filled with organic material, wherein
   in the direction perpendicular to the base substrate, the first groove penetrates a same film layer as the first organic area.

7. The display panel of claim 1, further comprising at least one mental layer, wherein
   the at least one metal layer is provided between the planarization layer and the film layer where the first active layer is located; with the direction perpendicular to the base substrate as a projection direction, the first organic area is overlapped with one of the at least one metal layer.

8. The display panel of claim 1, further comprising at least two mental layer, wherein
   the at least two metal layers are provided between the planarization layer and the film layer where the first active layer is located, wherein
   the first organic area is located between the at least two metal layers; or
   the first organic area is located on one side one of the at least two metal layers, the one of the at least two mental layer faces away from the base substrate, and the one side of the one of the least two metal layers faces away from the base substrate; or
   the first organic area is located on one side of one of the at least two metal layers, the one of the at least two mental layer faces toward the base substrate, and the one side of the one of the least two metal layers faces toward the base substrate.

9. The display panel of claim 1, wherein
   in the direction perpendicular to the base substrate, the at least one first inorganic area is located between the film layer where the first active layer is located and the first organic area, and at least one inorganic layer is provided between the first organic area and the film layer where the first active layer is located.

10. The display panel of claim 9, wherein
    in the direction perpendicular to the base substrate, a length of the first organic area is H1, and a thickness of the at least one inorganic layer between the first organic area and the film layer where the first active layer is located is H2, wherein H2≥½×H1.

11. The display panel of claim 1, wherein
    in the direction perpendicular to the base substrate, the at least one first inorganic area is located between a film layer where the first gate is located and the first organic area, and at least one inorganic layer is provided between the first organic area and the film layer where the first gate is located.

12. The display panel of claim 11, wherein
    in the direction perpendicular to the base substrate, a length of the first organic area is H1, and a thickness of the at least one inorganic layer between the first organic area and the film layer where the first gate is located is H3, wherein H3≥½×H1.

13. The display panel of claim 1, wherein
with the direction perpendicular to the base substrate as a projection direction, the first organic area is overlapped with at least part of the first transistor.

14. The display panel of claim 13, wherein
with the direction perpendicular to the base substrate as the projection direction, the first organic area is located in an area between the first source and the first drain.

15. The display panel of claim 1, further comprising a first conductive structure and a second conductive structure, wherein
at least one insulating layer is provided between the first conductive structure and the second conductive structure, the second conductive structure is located on one side of the first conductive structure facing toward the base substrate, and the first conductive structure is connected to the second conductive structure through a second via hole, wherein
in the direction perpendicular to the base substrate, the second via hole penetrates a same film layer as the first organic area.

16. The display panel of claim 15, wherein
the first source is connected to the first active layer through a first via hole, and, wherein
a depth of the second via hole is less than a depth of the first via hole.

17. The display panel of claim 15, further comprising a first capacitor, wherein
the first capacitor comprises a first electrode plate and a second electrode plate, wherein in the direction perpendicular to the base substrate, the first electrode plate and the second electrode plate are located between the planarization layer and the film layer where the first active layer is located, and the first electrode plate is located on one side of the second electrode plate facing away from the base substrate;
the first conductive structure is a first-electrode-plate connection line, and the second conductive structure is the first electrode plate; and
the first-electrode-plate connection line is configured to provide a voltage signal for the first electrode plate.

18. The display panel of claim 15, further comprising a second transistor, wherein
the second transistor comprises a second active layer, a second gate, a second source, and a second drain, wherein
the second active layer is located on one side of the first active layer facing away from the base substrate;
the second gate is located on one side of the first active layer facing away from the base substrate; and
the first active layer comprises silicon, and the second active layer comprises an oxide semiconductor.

19. A display device, comprising a display panel, wherein the display panel comprises:
a base substrate;
a first transistor, wherein the first transistor comprises a first active layer, a first gate, a first source, and a first drain, wherein the first source and the first drain are located on one side of the first active layer facing away from the base substrate, and the first gate is located between the first active layer, and both the first source and the first drain; and
a planarization layer, wherein the planarization layer is located a same side of the first source and the first drain facing away from the base substrate,
wherein,
in a direction perpendicular to the base substrate, at least one insulating layer and a first organic area are provided between a film layer where the first active layer is located and the planarization layer, and an insulating layer in the first organic area is made of organic material; and
the display panel comprises a display area and a non-display area, and the first organic area is located in the display area;
wherein
at least one first inorganic area is further provided between the film layer where the first active layer is located and the planarization layer, and an insulating layer in the at least one first inorganic area is made of inorganic material;
wherein
the display panel further comprises a first capacitor, wherein the first capacitor comprises a first electrode plate and a second electrode plate; and
wherein
in the direction perpendicular to the base substrate, the first electrode plate and the second electrode plate are located between the planarization layer and the film layer where the first active layer is located, and the first electrode plate is located on one side of the second electrode plate facing away from the base substrate, wherein the first organic area is located between the first electrode plate and the planarization layer, and at least one inorganic layer is provided between the first organic area and the first electrode plate.

* * * * *